United States Patent
Kurata et al.

(10) Patent No.: US 8,916,862 B2
(45) Date of Patent: Dec. 23, 2014

(54) ORGANIC EL PANEL, DISPLAY DEVICE USING SAME, AND METHOD FOR PRODUCING ORGANIC EL PANEL

(75) Inventors: Keiko Kurata, Hyogo (JP); Noriyuki Matsusue, Osaka (JP); Kazuhiro Yoneda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/819,059

(22) PCT Filed: Nov. 24, 2010

(86) PCT No.: PCT/JP2010/006859
§ 371 (c)(1),
(2), (4) Date: Feb. 26, 2013

(87) PCT Pub. No.: WO2012/070085
PCT Pub. Date: May 31, 2012

(65) Prior Publication Data
US 2013/0285023 A1    Oct. 31, 2013

(51) Int. Cl.
*H01L 51/56* (2006.01)
*H01L 51/52* (2006.01)
*H05B 33/14* (2006.01)
*H01L 27/32* (2006.01)

(52) U.S. Cl.
CPC ........ *H01L 51/5203* (2013.01); *H01L 51/5265* (2013.01); *H05B 33/14* (2013.01); *H01L 51/56* (2013.01); *H01L 27/3211* (2013.01); *H01L 2251/558* (2013.01)
USPC ................... 257/40; 257/72; 257/88; 257/89; 257/E33.064; 438/29; 313/505

(58) Field of Classification Search
CPC . H01L 51/56; H01L 51/5265; H01L 51/5203; H01L 27/3211
See application file for complete search history.

(56) References Cited

U.S. PATENT DOCUMENTS

| 5,443,922 A | 8/1995 | Nishizaki et al. |
| 6,541,130 B2 | 4/2003 | Fukuda |

(Continued)

FOREIGN PATENT DOCUMENTS

| CN | 101138107 | 3/2008 |
| CN | 101582440 | 11/2009 |

(Continued)

OTHER PUBLICATIONS

Office Action from United States patent and Trademark Office (USPTO) in U.S. Appl. No. 13/488,987, dated Jan. 16, 2014.

(Continued)

*Primary Examiner* — Minh-Loan Tran
*Assistant Examiner* — Fazli Erdem
(74) *Attorney, Agent, or Firm* — Greenblum & Bernstein, P.L.C.

(57) ABSTRACT

To increase light-extraction efficiency and simplify manufacturing process. An organic EL panel includes: first electrode reflecting incident light; second electrode transmitting incident light therethrough; organic light-emitting layer emitting light of corresponding color among RGB colors; first functional layer including charge injection/transport layer and at least one other layer, and disposed between the first electrode and the light-emitting layer; and second functional layer disposed between the second electrode and the light-emitting layer. The first functional layers of the RGB colors are equal in film thickness, the organic light-emitting layers of the RGB colors are equal in optical distance from the first electrode, the second functional layers of the RGB colors are equal in film thickness, the organic light-emitting layers of the RGB colors are equal in optical distance from the second electrode, and the organic light-emitting layers of the RGB colors differ in film thickness.

29 Claims, 17 Drawing Sheets

(56) References Cited

U.S. PATENT DOCUMENTS

| | | | |
|---|---|---|---|
| 6,737,800 B1 | 5/2004 | Winters et al. | |
| 7,132,789 B2 | 11/2006 | Kobayashi | |
| 7,259,514 B2 | 8/2007 | Murayama et al. | |
| 7,431,997 B2 | 10/2008 | Hwang et al. | |
| 7,518,141 B2 | 4/2009 | Nakamura | |
| 7,601,988 B2 | 10/2009 | Seo et al. | |
| 7,605,535 B2 | 10/2009 | Kobayashi | |
| 7,737,627 B2 | 6/2010 | Hwang et al. | |
| 7,741,770 B2 | 6/2010 | Cok et al. | |
| 7,851,989 B2 | 12/2010 | Noda | |
| 7,872,256 B2 | 1/2011 | Sung et al. | |
| 7,875,893 B2 | 1/2011 | Seo et al. | |
| 7,915,820 B2 * | 3/2011 | Lee et al. | 313/509 |
| 7,960,908 B2 | 6/2011 | Okutani et al. | |
| 7,973,319 B2 | 7/2011 | Kashiwabara et al. | |
| 8,008,852 B2 | 8/2011 | Aratani et al. | |
| 8,021,764 B2 | 9/2011 | Hwang et al. | |
| 8,021,765 B2 | 9/2011 | Hwang et al. | |
| 8,076,687 B2 | 12/2011 | Kobayashi et al. | |
| 8,188,315 B2 | 5/2012 | Hwang et al. | |
| 8,188,491 B2 | 5/2012 | Seo et al. | |
| 8,203,158 B2 * | 6/2012 | Yoshida et al. | 257/89 |
| 8,373,170 B2 * | 2/2013 | Murakami | 257/72 |
| 8,766,282 B2 * | 7/2014 | Noh | 257/79 |
| 2003/0044639 A1 * | 3/2003 | Fukuda | 428/690 |
| 2005/0099118 A1 | 5/2005 | Kobayashi | |
| 2005/0221124 A1 | 10/2005 | Hwang et al. | |
| 2005/0285508 A1 | 12/2005 | Murayama et al. | |
| 2006/0020136 A1 | 1/2006 | Hwang et al. | |
| 2006/0108919 A1 | 5/2006 | Kobayashi | |
| 2006/0115680 A1 | 6/2006 | Hwang et al. | |
| 2006/0121313 A1 | 6/2006 | Lee et al. | |
| 2006/0232203 A1 | 10/2006 | Noda | |
| 2007/0013282 A1 | 1/2007 | Okutani et al. | |
| 2007/0057264 A1 * | 3/2007 | Matsuda | 257/88 |
| 2007/0102737 A1 | 5/2007 | Kashiwabara et al. | |
| 2007/0131948 A1 | 6/2007 | Seo et al. | |
| 2007/0228367 A1 * | 10/2007 | Nakamura | 257/40 |
| 2007/0231503 A1 | 10/2007 | Hwang et al. | |
| 2007/0286944 A1 * | 12/2007 | Yokoyama et al. | 427/66 |
| 2008/0018239 A1 * | 1/2008 | Matsuda et al. | 313/504 |
| 2008/0030129 A1 | 2/2008 | Aratani et al. | |
| 2008/0107919 A1 | 5/2008 | Hwang et al. | |
| 2008/0203898 A1 * | 8/2008 | Kobayashi | 313/498 |
| 2008/0252206 A1 * | 10/2008 | Ryu | 313/504 |
| 2008/0258609 A1 | 10/2008 | Nakamura | |
| 2009/0026921 A1 | 1/2009 | Kuma et al. | |
| 2009/0072709 A1 * | 3/2009 | Kobayashi | 313/503 |
| 2009/0081480 A1 * | 3/2009 | Takeda et al. | 428/690 |
| 2009/0091238 A1 | 4/2009 | Cok et al. | |
| 2009/0096358 A1 * | 4/2009 | Lee et al. | 313/504 |
| 2009/0096359 A1 * | 4/2009 | Lee et al. | 313/504 |
| 2009/0278450 A1 * | 11/2009 | Sonoyama et al. | 313/504 |
| 2009/0283786 A1 * | 11/2009 | Kobayashi et al. | 257/98 |
| 2010/0006872 A1 | 1/2010 | Seo et al. | |
| 2010/0231484 A1 | 9/2010 | Cok et al. | |
| 2011/0108864 A1 | 5/2011 | Seo et al. | |
| 2011/0140101 A1 | 6/2011 | Noda | |
| 2011/0241038 A1 | 10/2011 | Kashiwabara et al. | |
| 2011/0316414 A1 | 12/2011 | Nendai | |
| 2012/0025224 A1 | 2/2012 | Yuasa | |
| 2012/0099312 A1 * | 4/2012 | Yoshioka et al. | 362/235 |
| 2012/0104423 A1 | 5/2012 | Kurata et al. | |
| 2012/0126272 A1 | 5/2012 | Kurata et al. | |
| 2012/0205688 A1 | 8/2012 | Seo et al. | |
| 2012/0211733 A1 | 8/2012 | Hwang et al. | |
| 2012/0241780 A1 | 9/2012 | Kurata et al. | |
| 2013/0193419 A1 * | 8/2013 | Mizuno | 257/40 |

FOREIGN PATENT DOCUMENTS

| | | |
|---|---|---|
| EP | 1052708 | 11/2000 |
| EP | 1862524 | 12/2007 |
| JP | 4-137485 | 5/1992 |
| JP | 4-328294 | 11/1992 |
| JP | 5-163488 | 6/1993 |
| JP | 2000-323277 | 11/2000 |
| JP | 2004-014360 | 1/2004 |
| JP | 2004-253389 | 9/2004 |
| JP | 2005-100946 | 4/2005 |
| JP | 2005-116516 | 4/2005 |
| JP | 2005-209421 | 8/2005 |
| JP | 2005-317255 | 11/2005 |
| JP | 2005-322435 | 11/2005 |
| JP | 2006-012579 | 1/2006 |
| JP | 2006-156344 | 6/2006 |
| JP | 2006-173089 | 6/2006 |
| JP | 2006-179780 | 7/2006 |
| JP | 2006-303463 | 11/2006 |
| JP | 2007-027042 | 2/2007 |
| JP | 2007-157732 | 6/2007 |
| JP | 2007-280677 | 10/2007 |
| JP | 2007-318101 | 12/2007 |
| JP | 2008-041925 | 2/2008 |
| JP | 4046948 | 2/2008 |
| JP | 2009-272150 | 11/2009 |
| JP | 2009-277507 | 11/2009 |
| JP | 2010-067482 | 3/2010 |
| JP | 2010-118163 | 5/2010 |
| JP | 2010-251156 | 11/2010 |
| WO | 2009/048520 | 4/2009 |
| WO | 2011/083515 | 7/2011 |

OTHER PUBLICATIONS

Office Action from United States patent and Trademark Office (USPTO) in U.S. Appl. No. 13/819,066, dated Jan. 10, 2014.
Office Action from United States patent and Trademark Office (USPTO) in U.S. Appl. No. 13/819,062, dated Feb. 6, 2014.
U.S. Appl. No. 13/488,987 to Keiko Kurata et al., filed Jun. 5, 2012.
U.S. Appl. No. 13/819,062 to Keiko Kurata et al., filed Feb. 26, 2013.
U.S. Appl. No. 13/819,066 to Keiko Kurata et al., filed Feb. 26, 2013.
U.S. Appl. No. 13/818,797 to Keiko Kurata et al., filed Feb. 25, 2013.
International Search Report and Written Opinion in PCT/JP2010/000087, dated Feb. 2, 2010.
International Search Report and Written Opinion in PCT/JP2010/006862, dated Jan. 11, 2011, corrected version.
International Search Report and Written Opinion in PCT/JP2010/006859, dated Jan. 11, 2011.
International Search Report and Written Opinion in PCT/JP2010/006861, dated Jan. 11, 2011.
International Search Report and Written Opinion in PCT/JP2010/006860, dated Jan. 11, 2011.
International Preliminary Report on Patentability in PCT/JP2010/000087, dated Dec. 5, 2011.
United States Office Action in U.S. Appl. No. 13/488,987, dated Jul. 3, 2013.
Office Action from the Patent Office of the People's Republic of China in Chinese Patent Application No. 201080059449.5, dated Jun. 13, 2014, together with a partial English language translation thereof.
Office Action from United States Patent and Trademark Office (USPTO) in U.S. Appl. No. 13/819,066, dated May 6, 2014.
Advisory Action from United States Patent and Trademark Office (USPTO) in U.S. Appl. No. 13/488,987, dated May 12, 2014.
International Preliminary Report on Patentability in PCT/JP2010/006862, dated Oct. 18, 2012, together with an English language translation thereof.
International Preliminary Report on Patentability in PCT/JP2010/006859, dated Oct. 17, 2012, together with an English language translation thereof.
International Preliminary Report on Patentability in PCT/JP2010/006861, dated Oct. 22, 2012, together with an English language translation thereof.
International Preliminary Report on Patentability in PCT/JP2010/006860, dated Oct. 17, 2012, together with an English language translation thereof.
Office Action from U.S. Patent and Trademark Office (USPTO) in U.S. Appl. No. 13/818,797, dated Apr. 14, 2014.

* cited by examiner

FIG. 6A

| | | Example 1 | | |
|---|---|---|---|---|
| | | R | G | B |
| Film thickness (nm) | Electron transport layer | 30 | 30 | 30 |
| | Light-emitting layer | 90 | 70 | 55 |
| | Hole transport layer | 15 | 15 | 15 |
| | Hole injection layer | 5 | 5 | 5 |
| | Transparent conductive layer | 15 | 15 | 15 |
| | Efficiency (cd/A) | 2.1 | 5.0 | 35 |
| | Chromaticity (x, y) | 0.66, 0.34 | 0.28, 0.68 | 0.13, 0.06 |
| Design margin | Tolerable limits | −10 to +10 nm | −9 to +11 nm | −15 to +11 nm |
| | Tolerable margin width | 20 nm (57%) | 20 nm (57%) | 26 nm (74%) |

FIG. 6B

| | | Comparative example 1 | | |
|---|---|---|---|---|
| | | R | G | B |
| Film thickness (nm) | Electron transport layer | 30 | 30 | 30 |
| | Light-emitting layer | 80 | 80 | 60 |
| | Hole transport layer | 20 | 9 | 5 |
| | Hole injection layer | 5 | 5 | 5 |
| | Transparent conductive layer | 15 | 15 | 15 |
| | Efficiency (cd/A) | 2.1 | 5.0 | 25 |
| | Chromaticity (x, y) | 0.66, 0.34 | 0.28, 0.68 | 0.13, 0.06 |
| Design margin | Tolerable limits | −11 to +9 nm | −7 to +11 nm | −7 to +11 nm |
| | Tolerable margin width | 20 nm (50%) | 18 nm (62%) | 18 nm (72%) |

FIG. 7

| Efficiency variation in panel (%) | 20 |
|---|---|
| Chromaticity variation in panel | $\Delta x < 0.04$  $\Delta y < 0.04$ |
| Brightness | $\geq 90\%$ @30°<br>$\geq 80\%$ @45° |
| Brightness and chromaticity | $\Delta x < 0.04$ @50°<br>$\Delta y < 0.04$ @50° |

FIG. 8A

| Film thickness (nm) | Example 1 Red | Min | Ave | Max |
|---|---|---|---|---|
| | Electron transport layer | 27 | 30 | 33 |
| | Light-emitting layer | 81 | 90 | 99 |
| | Hole transport layer | 13.5 | 15 | 16.5 |
| | Hole injection layer | 4.5 | 5 | 5.5 |
| | Transparent conductive layer | 13.5 | 15 | 16.5 |
| | | 31.5 | 35 | 38.5 |

FIG. 8B

| Film thickness (nm) | Example 1 Green | Min | Ave | Max |
|---|---|---|---|---|
| | Electron transport layer | 27 | 30 | 33 |
| | Light-emitting layer | 63 | 70 | 77 |
| | Hole transport layer | 13.5 | 15 | 16.5 |
| | Hole injection layer | 4.5 | 5 | 5.5 |
| | Transparent conductive layer | 13.5 | 15 | 16.5 |
| | | 31.5 | 35 | 38.5 |

FIG. 8C

| Film thickness (nm) | Example 1 Blue | Min | Ave | Max |
|---|---|---|---|---|
| | Electron transport layer | 27 | 30 | 33 |
| | Light-emitting layer | 49.5 | 55 | 60.5 |
| | Hole transport layer | 13.5 | 15 | 16.5 |
| | Hole injection layer | 4.5 | 5 | 5.5 |
| | Transparent conductive layer | 13.5 | 15 | 16.5 |
| | | 31.5 | 35 | 38.5 |

FIG. 10A

Example 2

| | | R | G | B |
|---|---|---|---|---|
| Film thickness (nm) | Electron transport layer | 30 | 30 | 30 |
| | Light-emitting layer | 80 | 60 | 20 |
| | Hole transport layer | 25 | 25 | 25 |
| | Hole injection layer | 5 | 5 | 5 |
| | Transparent conductive layer | 20 | 20 | 20 |
| | | 50 | 50 | 50 |
| Efficiency (cd/A) | | 1.9 | 4.8 | 0.51 |
| Chromaticity (x, y) | | 0.66, 0.34 | 0.28, 0.67 | 0.13, 0.06 |
| Design margin | Tolerable limits | −13 to +13 nm | −18 to +10 nm | −14 to +11 nm |
| | Tolerable margin width | 26 nm (52%) | 28 nm (56%) | 25 nm (50%) |

FIG. 10B

Comparative example 2

| | | R | G | B |
|---|---|---|---|---|
| Film thickness (nm) | Electron transport layer | 30 | 30 | 30 |
| | Light-emitting layer | 80 | 80 | 60 |
| | Hole transport layer | 25 | 16 | 9 |
| | Hole injection layer | 5 | 5 | 5 |
| | Transparent conductive layer | 20 | 20 | 20 |
| | | 50 | 41 | 34 |
| Efficiency (cd/A) | | 1.9 | 4.7 | 0.49 |
| Chromaticity (x, y) | | 0.66, 0.34 | 0.28, 0.67 | 0.13, 0.06 |
| Design margin | Tolerable limits | −13 to +13 nm | −17 to +11 nm | −9 to +11 nm |
| | Tolerable margin width | 26 nm (52%) | 28 nm (68%) | 20 nm (59%) |

FIG. 11A

| Film thickness (nm) | Example 2 Red | | |
|---|---|---|---|
| | Min | Ave | Max |
| Electron transport layer | 27 | 30 | 33 |
| Light-emitting layer | 72 | 80 | 88 |
| Hole transport layer | 22.5 | 25 | 27.5 |
| Hole injection layer | 4.5 | 5 | 5.5 |
| Transparent conductive layer | 18 | 20 | 22 |
| | 45 | 50 | 55 |

FIG. 11B

| Film thickness (nm) | Example 2 Green | | |
|---|---|---|---|
| | Min | Ave | Max |
| Electron transport layer | 27 | 30 | 33 |
| Light-emitting layer | 54 | 60 | 66 |
| Hole transport layer | 22.5 | 25 | 27.5 |
| Hole injection layer | 4.5 | 5 | 5.5 |
| Transparent conductive layer | 18 | 20 | 22 |
| | 45 | 50 | 55 |

FIG. 11C

| Film thickness (nm) | Example 2 Blue | | |
|---|---|---|---|
| | Min | Ave | Max |
| Electron transport layer | 27 | 30 | 33 |
| Light-emitting layer | 18 | 20 | 22 |
| Hole transport layer | 22.5 | 25 | 27.5 |
| Hole injection layer | 4.5 | 5 | 5.5 |
| Transparent conductive layer | 18 | 20 | 22 |
| | 45 | 50 | 55 |

ORGANIC EL PANEL, DISPLAY DEVICE USING SAME, AND METHOD FOR PRODUCING ORGANIC EL PANEL

TECHNICAL FIELD

The present invention relates to an organic EL panel that relies on electroluminescence phenomenon of organic materials, a display device with the organic EL panel, and a method of manufacturing the organic EL panel. The present invention particularly relates to optical design for increasing light-extraction efficiency of each of R (Red), G (Green), and B (Blue) colors.

BACKGROUND ART

In recent years, there has been proposed adoption of organic EL (Electro Luminescence) panels that rely on electroluminescence phenomenon of organic materials as display panels for display devices such as digital televisions. A matrix of respective organic EL elements of the R, G, and B colors is arranged in a substrate of an organic EL panel.

It is important to increase light-extraction efficiency of the respective organic EL elements of the R, G, and B colors, from the standpoint of reducing power consumption, increasing service life of the organic EL panel, and the like. To this end, there has been proposed a number of arts for increasing light-extraction efficiency owing to creativity of optical design of the organic EL elements (see Patent Literatures 1 to 6). For example, Patent Literature 1 discloses that respective light-emitting elements of the R, G, and B colors are each constituted from a multilayer structure that is provided between a first electrode reflecting light and a second electrode transmitting light therethrough. The multiplayer structure includes a first layer generating holes, a second layer including a light-emitting layer of a corresponding color, and a third layer generating electrons. The first layer differs in film thickness among the R, G, and B colors (paragraphs 0022 to 0025). According to Patent Literature 1, light-extraction efficiency increases due to light interference phenomenon when the optical distance between the first electrode and the second layer is $(2m-1)/4$ times a light-emitting wavelength, where m is an arbitrary positive integer (paragraphs 0026 and 0027).

CITATION LIST

Patent Literature

[Patent Literature 1] Japanese Patent Application Publication No. 2006-156344
[Patent Literature 2] Japanese Patent Application Publication No. 2005-317255
[Patent Literature 3] Japanese Patent Application Publication No. 2005-322435
[Patent Literature 4] Japanese Patent Application Publication No. 2005-100946
[Patent Literature 5] Japanese Patent Application Publication No. 2008-41925
[Patent Literature 6] Japanese Patent Application Publication No. 2006-179780

SUMMARY OF INVENTION

Technical Problem

According to the above conventional art, however, the film thickness of the first layer for generating holes needs to be adjusted for each of the R, G, and B colors, and this complicates the manufacturing process.

In view of the above problem, the present invention aims to provide an organic EL panel, a display device with use of the organic EL panel, and a method of manufacturing the organic EL panel according to which light-extraction efficiency is increased due to light interference phenomenon, and the manufacturing process is simplified compared with conventional arts.

Solution to Problem

One aspect of the present invention provides an organic EL panel comprising: a first electrode of each of R (red), G (green), and B (blue) colors that reflects incident light; a second electrode that faces the first electrode of each of the R, G, and B colors, and transmits incident light therethrough; an organic light-emitting layer of each of the R, G, and B colors that is disposed between the first electrode of a corresponding color and the second electrode, and emits light of a corresponding color due to voltage application between the first electrode of the corresponding color and the second electrode; a first functional layer of each of the R, G, and B colors that is disposed between the first electrode of a corresponding color and the organic light-emitting layer of a corresponding color; and a second functional layer of each of the R, G, and B colors that is disposed between the second electrode and the organic light-emitting layer of a corresponding color, wherein a first portion of light of each of the R, G, and B colors emitted from the organic light-emitting layer of a corresponding color travels through the first functional layer of a corresponding color towards the first electrode of a corresponding color, strikes and is reflected by the first electrode of the corresponding color, and then is emitted externally after passing through the first functional layer of the corresponding color, the organic light-emitting layer of the corresponding color, the second functional layer of a corresponding color and the second electrode, a second portion of the light of each of the R, G, and B colors travels through the second functional layer of the corresponding color towards the second electrode instead of towards the first electrode of the corresponding color, and is emitted externally after passing through the second electrode, the respective first functional layers of the R, G, and B colors are equal in film thickness to one another, the respective organic light-emitting layers of the R, G, and B colors are equal to one another in optical distance from the first electrode of the corresponding color, the respective second functional layers of the R, G, and B colors are equal in film thickness to one another, the respective organic light-emitting layers of the R, G, and B colors are equal to one another in optical distance from the second electrode, and the respective organic light-emitting layers of the R, G, and B colors differ in film thickness from one another.

Advantageous Effects of Invention

Generally, the organic light-emitting layer needs to be formed separately for each of the R, G, and B colors irrespective of whether having the same film thickness among the R, G, and B colors, because of being formed from a different material for each of the R, G, and B colors. Compared with this, the first functional layer and the second functional layer are each formed from the same material among the R, G, and B colors. Accordingly, as long as the first functional layer and the second functional layer each have the same film thickness among the R, G, and B colors, the first functional layer and the second functional layer each do not need to be formed separately for each of the R, G, and B colors. According to the organic EL panel that is the one aspect of the present invention, the respective first functional layers of the R, G, and B colors have the same film thickness, the respective second functional layers of the R, G, and B colors have the same film thickness, and the respective organic light-emitting layers of the R, G, and B colors each have a different film thickness. In other words, film thickness adjustment for each of the R, G, and B colors is made on only the organic light-emitting layer, which originally needs to be formed separately for each of the R, G, and B colors. As a result, it is possible to increase light-extraction efficiency taking advantage of light interference phenomenon, and simplify the manufacturing process compared with conventional arts.

BRIEF DESCRIPTION OF DRAWINGS

FIG. 4A shows a case where no CF is used in Example 1, FIG. 4B shows a case where CFs are used in Example 1, FIG. 4C shows a case where no CF is used in Comparative example 1, and FIG. 4D shows a case where CFs are used in Comparative example 1.

FIG. 5A and FIG. 5B show variation of light-extraction efficiency when varying the film thickness of a hole transport layer, in the case where no CF is used and the case where CFs are used, respectively, and FIG. 5C and FIG. 5D show variation of light-extraction efficiency when varying the film thickness of an organic light-emitting layer, in the case where no CF is used and the case where CFs are used, respectively.

FIG. 6A and FIG. 6B show light-extraction efficiency and so on when a hole transport layer is set to have an optimal film thickness in Example 1 and Comparative example 1, respectively.

FIG. 7 show allowable ranges.

FIG. 8A to FIG. 8C each show the minimum value, the average value, and the maximum value of the film thickness of each layer constituting the organic EL element in Example 1, with respect to the R, G, and B colors, respectively.

FIG. 9A shows a case where no CF is used in Example 2, FIG. 9B shows a case where CFs are used in Example 2, FIG. 9C shows a case where no CF is used in Comparative example 2, and FIG. 9D shows a case where CFs are used in Comparative example 2.

FIG. 10A and FIG. 10B show light-extraction efficiency and so on when a hole transport layer is set to have an optimal film thickness in Example 2 and Comparative example 2, respectively.

FIG. 11A to FIG. 11C each show the minimum value, the average value, and the maximum value of the film thickness of each layer constituting an organic EL element in Example 2, with respect to the R, G, and B colors, respectively.

FIG. 12A shows a case where no CF is used in Example 3, FIG. 12B shows a case where CFs are used in Example 3, FIG. 12C shows a case where no CF is used in Comparative example 3, and FIG. 12D shows a case where CFs are used in Comparative example 3.

DESCRIPTION OF EMBODIMENTS

Figure 1:
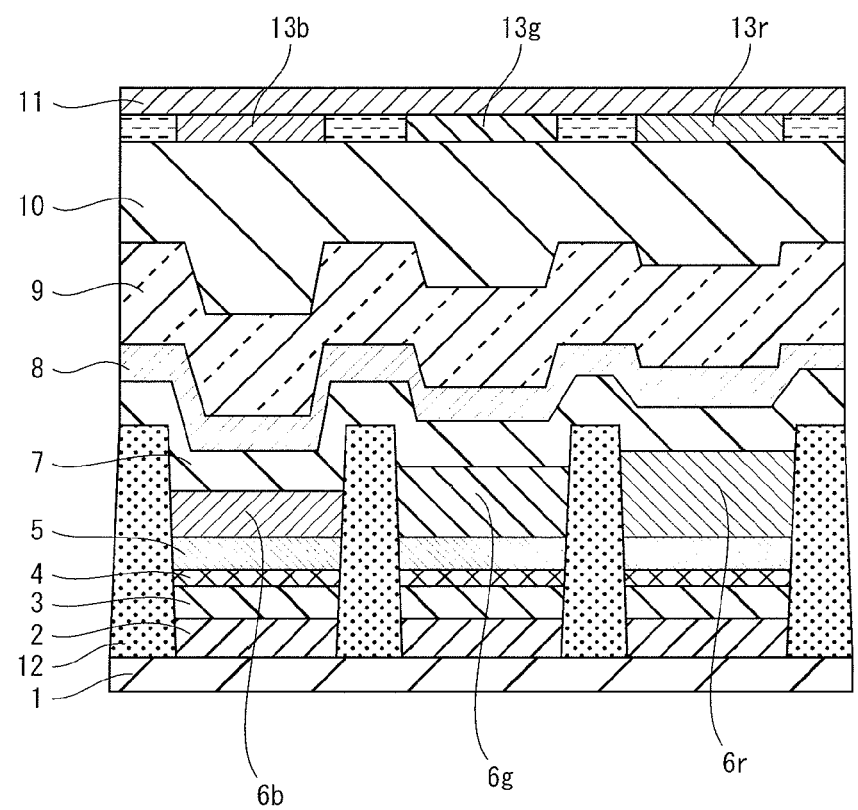
FIG. 1 is a cross-sectional diagram schematically showing the pixel structure of an organic EL panel according to an embodiment of the present invention.

[Outline of Aspects of the Present Invention]

One aspect of the present invention provides an organic EL panel comprising: a first electrode of each of R (red), G (green), and B (blue) colors that reflects incident light; a second electrode that faces the first electrode of each of the R, G, and B colors, and transmits incident light therethrough; an organic light-emitting layer of each of the R, G, and B colors that is disposed between the first electrode of a corresponding color and the second electrode, and emits light of a corresponding color due to voltage application between the first electrode of the corresponding color and the second electrode; a first functional layer of each of the R, G, and B colors that is disposed between the first electrode of a corresponding color and the organic light-emitting layer of a corresponding color; and a second functional layer of each of the R, G, and B colors that is disposed between the second electrode and the organic light-emitting layer of a corresponding color, wherein a first portion of light of each of the R, G, and B colors emitted from the organic light-emitting layer of a corresponding color travels through the first functional layer of a corresponding color towards the first electrode of a corresponding color, strikes and is reflected by the first electrode of the corresponding color, and then is emitted externally after passing through the first functional layer of the corresponding color, the organic light-emitting layer of the corresponding color, the second functional layer of a corresponding color and the second electrode, a second portion of the light of each of the R, G, and B colors travels through the second functional layer of the corresponding color towards the second electrode instead of towards the first electrode of the corresponding color, and is emitted externally after passing through the second electrode, the respective first functional layers of the R, G, and B colors are equal in film thickness to one another, the respective organic light-emitting layers of the R, G, and B colors are equal to one another in optical distance from the first electrode of the corresponding color, the respective second functional layers of the R, G, and B colors are equal in film thickness to one another, the respective organic light-emitting layers of the R, G, and B colors are equal to one another in optical distance from the second electrode, and the respective organic light-emitting layers of the R, G, and B colors differ in film thickness from one another.

Generally, the organic light-emitting layer needs to be formed separately for each of the R, G, and B colors irrespective of whether having the same film thickness among the R, G, and B colors, because of being formed from a different material for each of the R, G, and B colors. Compared with this, the first functional layer and the second functional layer are each formed from the same material among the R, G, and B colors. Accordingly, as long as the first functional layer and the second functional layer each have the same film thickness among the R, G, and B colors, the first functional layer and the second functional layer each do not need to be formed separately for each of the R, G, and B colors. According to the organic EL panel that is the one aspect of the present invention, the respective first functional layers of the R, G, and B colors have the same film thickness, the respective second functional layers of the R, G, and B colors have the same film thickness, and the respective organic light-emitting layers of the R, G, and B colors each have a different film thickness. In other words, film thickness adjustment for each of the R, G, and B colors is made on only the organic light-emitting layer, which originally needs to be formed separately for each of the R, G, and B colors. As a result, it is possible to increase light-extraction efficiency taking advantage of light interference phenomenon, and simplify the manufacturing process compared with conventional arts.

Also, the organic EL panel may further comprise a color filter of each of the R, G, and B colors that is disposed opposite the organic light-emitting layer of a corresponding color with the second electrode being interposed therebetween, wherein the film thickness of the organic light-emitting layer of each of the R, G, and B colors may be adjusted so as to correspond to a local maximum of light-extraction efficiency with respect to the light of the corresponding color emitted externally after passing through the color filter of the corresponding color.

The researches made by the present inventors proved that when the film thickness of each layer constituting an organic EL element is varied, both the light-extraction efficiency and the chromaticity vary, and that a chromaticity corresponding to a local maximum of light-extraction efficiency is not necessarily at the neighborhood of a target chromaticity.

The more greatly a current chromaticity differs from the target chromaticity, the more chromaticity correction needs to be made with use of a color filter (CF). As a result, there is a case where though a chromaticity before chromaticity correction corresponds to a local maximum of light-extraction efficiency, a chromaticity after the chromaticity correction does not correspond to a local maximum of light-extraction efficiency. According to the one aspect of the present invention, the film thickness of the organic light-emitting layer is set so as to correspond to a local maximum of light-extraction efficiency with respect to light after passing through a color filter. Therefore, it is possible to make the current chromaticity to approach to the target chromaticity and increase the light-extraction efficiency.

Also, a film thickness of the first functional layer of each of the R, G, and B colors may be adjusted so as to correspond to a first local maximum of light-extraction efficiency with respect to the light of the corresponding color emitted externally after passing through the color filter of the corresponding color.

Variation of the film thickness of the first functional layer causes cyclic variation of the light-extraction efficiency. As a result, a local maximum of light-extraction efficiency cyclically appears. Here, a local maximum that cyclically appears is referred to as the first local maximum, the second local maximum, and the third local maximum, . . . , in order of increasing corresponding film thickness of the first functional layer. The researches made by the present inventors proved that a local maximum with a smaller degree has a larger value, and correspond to the substantially same film thickness of each of the R, G, and B colors. According to the one aspect of the present invention, the film thickness of the first functional layer corresponds to the first local maximum. Accordingly, it is possible to increase light-extraction efficiency compared with the case where the film thickness of the first functional layer corresponds to a local maximum with other degree, and furthermore set the respective first functional layers of the R, G, and B colors to have the same film thickness.

Also, at least one of the respective organic light-emitting layers of the R, G, and B colors may have a film thickness that does not correspond to a local maximum of light-extraction efficiency with respect to the light of the corresponding color before passing through the color filter of the corresponding color.

Even in the above case, a local maximum of light-extraction efficiency appears with respect to the light after passing through the color filter. This increases light-extraction efficiency.

Also, the respective first functional layers of the R, G, and B colors each may have a film thickness of 31.5 nm to 38.5 nm, the respective organic light-emitting layers of the R, G, and B colors each may have an optical distance of 57.6 nm to 70.4 nm from the first electrode of the corresponding color, and the respective organic light-emitting layers of the R, G, and B colors may have a film thickness of 81 nm to 99 nm, a film thickness of 63 nm to 77 nm, and a film thickness of 49.5 nm to 60.5 nm, respectively.

Also, the first functional layer of each of the R, G, and B colors may include a transparent conductive layer formed on an anode that is the first electrode of the corresponding color, a hole injection layer formed on the transparent conductive layer, and a hole transport layer formed on the hole injection layer, the respective transparent conductive layers of the R, G, and B colors each may have a film thickness of 13.5 nm to 16.5 nm, the respective hole injection layers of the R, G, and B colors each may have a film thickness of 4.5 nm to 5.5 nm, and the respective hole transport layers of the R, G, and B colors each may have a film thickness of 13.5 nm to 16.5 nm.

Also, the respective second functional layers of the R, G, and B colors each may have a film thickness of 27 nm to 33 nm, and the respective organic light-emitting layers of the R, G, and B colors each may have an optical distance of 48.6 nm to 59.4 nm from the second electrode.

Also, the second functional layer of each of the R, G, and B colors may include an electron transport layer having a film thickness of 27 nm to 33 nm.

Also, the respective first functional layers of the R, G, and B colors each may have a film thickness of 45 nm to 55 nm, the respective organic light-emitting layers of the R, G, and B colors each may have an optical distance of 81.5 nm to 99.6 nm from the first electrode of the corresponding color, and the respective organic light-emitting layers of the R, G, and B colors may have a film thickness of 72 nm to 88 nm, a film thickness of 54 nm to 66 nm, a film thickness of 18 nm to 22 nm, respectively.

Also, the first functional layer of each of the R, G, and B colors may include a transparent conductive layer formed on an anode that is the first electrode of the corresponding color, a hole injection layer formed on the transparent conductive layer, and a hole transport layer formed on the hole injection layer, the respective transparent conductive layers of the R, G, and B colors each may have a film thickness of 18 nm to 22 nm, the respective hole injection layers of the R, G, and B colors each may have a film thickness of 4.5 nm to 5.5 nm, and the respective hole transport layers of the R, G, and B colors each may have a film thickness of 22.5 nm to 27.5 nm.

Also, the respective second functional layers of the R, G, and B colors each may have a film thickness of 27 nm to 33 nm, and the respective organic light-emitting layers of the R, G, and B colors each may have an optical distance of 48.6 nm to 59.4 nm from the second electrode.

Also, the second functional layer of each of the R, G, and B colors may include an electron transport layer having a film thickness of 27 nm to 33 nm.

Also, the organic light-emitting layer of each of the R, G, and B colors may contain an organic material, and may be formed by a printing method.

One aspect of the present invention provides a display device with use of the above organic EL panel.

One aspect of the present invention provides a manufacturing method of manufacturing an organic EL panel comprising: a first step of preparing a first electrode of each of R (red), G (green), and B (blue) colors that reflects incident light; a second step of disposing a first functional layer of each of the R, G, and B colors on the first electrode of a corresponding color; a third step of disposing an organic light-emitting layer that emits light of each of the R, G, and B colors on the first functional layer of a corresponding color; a fourth step of disposing a second functional layer of each of the R, G, and B colors on the organic light-emitting layer of a corresponding color; and a fifth step of disposing a second electrode that transmits incident light therethrough on the respective second functional layers of the R, G, and B colors so as to face the respective first electrodes of the R, G, and B colors, wherein in the second step, the first functional layer is disposed such that the respective first functional layers of the R, G, and B colors are equal in film thickness to one another, and the respective organic light-emitting layers of the R, G, and B colors are equal to one another in optical distance from the first electrode of the corresponding color, in the third step, the organic light-emitting layer is disposed such that the respective organic light-emitting layers of the R, G, and B colors differ in film thickness from one another, and in the fourth step, the second functional layer is disposed such that the respective second functional layers of the R, G, and B colors are equal in film thickness to one another, and the respective organic light-emitting layers of the R, G, and B colors are equal to one another in optical distance from the second electrode.

In the present Description, the expressions "have the same film thickness", "equal in film thickness", and so on indicate not only a case where respective layers of the R, G, and B colors have the same measured value of film thickness, but also a case where the respective layers of the R, G, and B colors each have a different measured value of film thickness within a manufacturing error range of ±10%.

[Pixel Structure of Organic EL Panel]

FIG. 1 is a cross-sectional diagram schematically showing the pixel structure of an organic EL panel according to an embodiment of the present invention.

The organic EL panel has R, G, and B pixels arranged regularly in a matrix of rows and columns. Each pixel is formed by an organic EL element with use of an organic material.

The blue organic EL element includes a substrate 1, a reflective electrode 2, a transparent conductive layer 3, a hole injection layer 4, a hole transport layer 5, an organic light-emitting layer 6b, an electron transport layer 7, a transparent electrode 8, a thin-film passivation layer 9, a resin passivation layer 10, a substrate 11, and a CF 13b. Hereinafter, the transparent conductive layer 3, the hole injection layer 4, and the hole transport layer 5 that are provided between the reflective electrode 2 and the organic light-emitting layer 6b are also collectively referred to as "first functional layer". Furthermore, the electron transport layer 7 that is provided between the organic light-emitting layer 6b and the transparent electrode 8 is also referred to as "second functional layer".

The green organic EL element has the same structure as the blue organic EL element, except for an organic light-emitting layer 6g and a CF 13g. The red organic EL element also has the same structure as the blue organic EL element, except for an organic light-emitting layer 6r and a CF 13r. In this example, the substrate 1, the electron transport layer 7, the transparent electrode 8, the thin-film passivation layer 9, the resin passivation layer 10, and the substrate 11 are shared by the respective organic EL elements of the R, G, and B colors, whereas other layers are partitioned by banks 12 among the respective organic EL elements of the R, G, and B colors.

Figure 2:
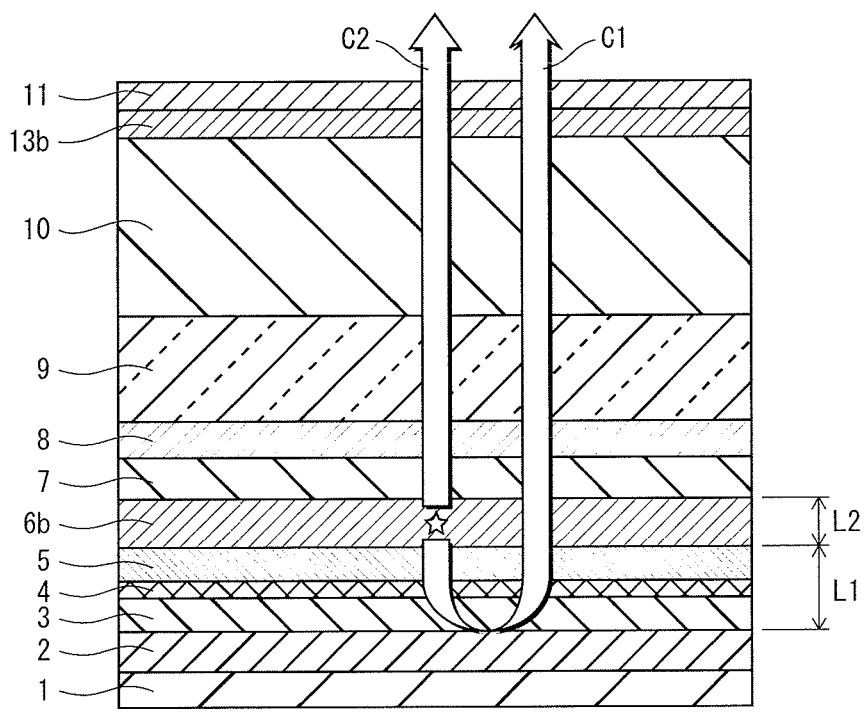
FIG. 2 shows an example of a cavity structure in a blue organic EL element.

Also, in the organic EL element of each of the R, G, and B colors, a cavity structure is realized due to light interference phenomenon by providing the corresponding reflective electrode 2. FIG. 2 shows an example of a cavity structure in the blue organic EL element. Two optical paths are formed in the blue organic EL element. One is a first optical path C1, in which a portion of light emitted from the organic light-emitting layer 6b travels through the first functional layer towards the reflective electrode 2, strikes and is reflected by the reflective electrode 2, and then is emitted externally after passing through the first functional layer, the organic light-emitting layer 6b, the second functional layer, and the transparent electrode 8. The other is a second optical path C2, in which a remaining portion of the light emitted from the organic light-emitting layer 6b travels through the second functional layer towards the transparent electrode 8 instead of towards the reflective electrode 2, and then is emitted externally after passing through the transparent electrode 8. By appropriately setting the film thickness of the first functional layer, it is possible to cause light traveling the first optical path C1 and light traveling the second optical path C2 to strengthen each other, thereby increasing light-extraction efficiency.

In the present embodiment, the respective first functional layers of the R, G, and B colors have the same structure, are formed from the same material, and have the same film thickness. Accordingly, the respective organic light-emitting layers of the R, G, and B colors have the same optical distance from the reflective electrode. Note that for a single layer structure, the optical distance is the product of a film thickness and a refractive index, and for a multilayer structure with two or more layers, the optical distance is the sum of the product of the film thickness and the refractive index for each layer.

Also, the respective second functional layers of the R, G, and B colors have the same structure, are formed from the same material, and have the same film thickness. Accordingly, the respective organic light-emitting layers of the R, G, and B colors have the same optical distance from the transparent electrode.

Compared with this, the respective organic light-emitting layers of the R, G, and B colors are each formed from a different material, and each have a different film thickness. Specifically, the film thickness of each of the respective organic light-emitting layers of the R, G, and B colors is adjusted so as to correspond to a local maximum of light-extraction efficiency of light after passing through a CF of a corresponding color.

Generally, the first functional layer and second functional layer each do not need to be formed separately for each of the R, G, and B colors, because of being formed from the same material for each of the R, G, and B colors. Compared with this, the organic light-emitting layer needs to be formed separately for each of the R, G, and B colors, because of being formed from a different material for each of the R, G, and B colors. The first functional layer and the second functional layer, which do not need to be formed separately for each of the R, G, and B colors, each have the same film thickness among the R, G, and B colors. The organic light-emitting layer, which originally needs to be formed separately for each of the R, G, and B colors, differs in film thickness among the R, G, and B colors. Therefore, it is possible to simplify the manufacturing process.

The following describes in detail the film thickness of each layer constituting an organic EL element.

[First Simulations]

The present inventors prepared Example 1 and Comparative example 1, and calculated an optimal film thickness of each layer constituting an organic EL element in Example 1 and Comparative example 1 through simulations to evaluate the light-extraction efficiency and the simplicity of the manufacturing process.

Figure 3:
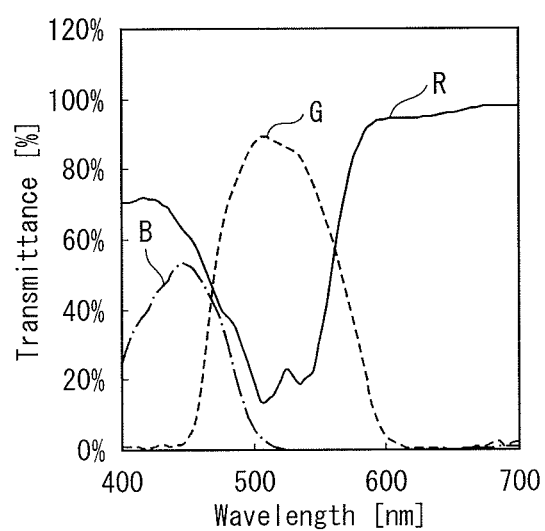
FIG. 3 shows the transmission spectrum of each of respective color filters (CFs) of the R, G, and B colors used in simulations.

In the first simulations, a reflective electrode is formed from an alloy of Ag, a transparent conductive layer is formed from ITO (Indium Tin Oxide), and respective organic light-emitting layers of the R, G, and B colors are formed from RP158, GP1200, and BP105 manufactured by Sumation Co., Ltd., respectively. FIG. 3 shows the transmission spectrum of each of respective CFs of the R, G, and B colors used in the first simulations. The present inventors created the characteristics of the CFs (hereinafter, "CF characteristics") used in the first simulations, by making appropriate adjustments based on a known art in view of the optical characteristics in the present embodiment. For example, the respective CF characteristics for the R and G colors are based on Japanese Patent Application Publication 2005-116516 (FIG. 5), and the CF characteristics for the B color are based on B440 by Opto-Line, Inc.

Figure 4A:
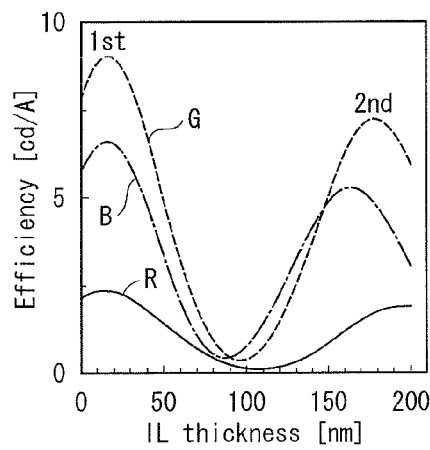
FIG. 4A to FIG. 4D show variation of light-extraction efficiency when varying the film thickness of a hole transport layer.
Figure 4C:
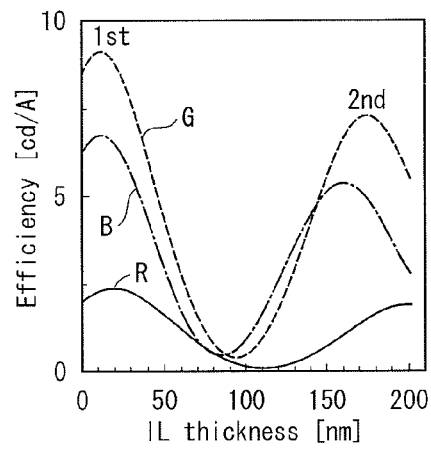
Figure 4B:
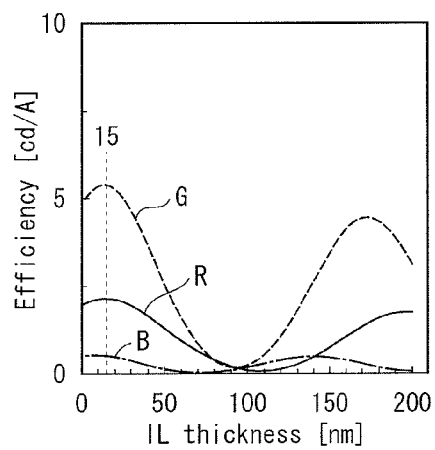
Figure 4D:
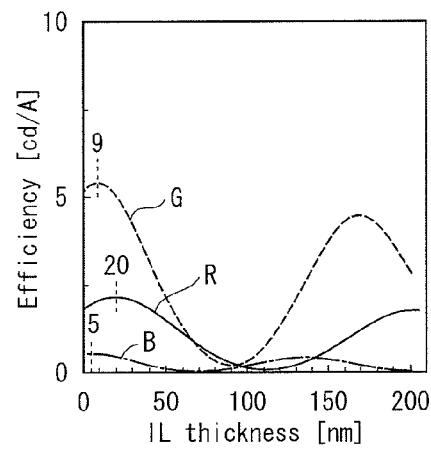

FIG. 4A to FIG. 4D show variation of light-extraction efficiency when varying the film thickness of the hole transport layer, FIG. 4A shows a case where no CF is used in Example 1, FIG. 4B shows a case where CFs are used in Example 1, FIG. 4C shows a case where no CF is used in Comparative example 1, and FIG. 4D shows a case where CFs are used in Comparative example 1.

In Example 1, an electron transport layer of each of the R, G, and B colors has a fixed film thickness of 30 nm, a hole injection layer of each of the R, G, and B colors has a fixed film thickness of 5 nm, a transparent conductive layer of each of the R, G, and B colors has a fixed film thickness of 15 nm. Respective organic light-emitting layers of the R, G, and B colors have a fixed film thickness of 90 nm, a fixed film thickness of 70 nm, and a fixed film thickness of 55 nm, respectively. The film thickness of only the hole transport layer is varied.

In Comparative example 1, an electron transport layer of each of the R, G, and B colors has a fixed film thickness of 30 nm, a hole injection layer of each of the R, G, and B colors has a fixed film thickness of 5 nm, a transparent conductive layer of each of the R, G, and B colors has a fixed film thickness of 15 nm. Respective organic light-emitting layers of the R, G, and B colors have a fixed film thickness of 80 nm, a fixed film thickness of 80 nm, and a fixed film thickness of 60 nm, respectively. The film thickness of only the hole transport layer is varied.

In the case where a CF is used, the following calculations are made with respect to all the film thicknesses that are simulation targets to calculate an optimal film thickness. An arbitrary film thickness is selected, and a chromaticity corresponding to the arbitrary film thickness in the case where no CF is used is calculated. CF characteristics for approximating the calculated chromaticity to a target chromaticity are calculated. Then, light-extraction efficiency in the case where a CF having the calculated CF characteristics is calculated.

FIG. 4A and FIG. 4C demonstrate the following points (1) to (3).

Point (1): Variation of the film thickness of the hole transport layer causes cyclic variation of the light-extraction efficiency. As a result, a local maximum of light-extraction efficiency cyclically appears.

Point (2): The cycle in which a local maximum appears shortens in the order of the R, G, and B colors. That is, the cycle in which a local maximum appears shortens as wavelength of light shortens.

Point (3): When a local maximum that cyclically appears is referred to as the first local maximum, the second local maximum, . . . , in order of increasing film thickness of the hole transport layer, a local maximum with a smaller degree has a larger value.

The points (1) and (2) indicate that interference occurs between light traveling the first optical path C1 and light traveling the second optical path C2. Also, the point (3) indicates that the light-extraction efficiency is increased more by setting the film thickness of the hole transport layer so as to correspond to a local maximum with a smaller degree.

Also according to FIG. 4B, in order to increase the light-extraction efficiency in Example 1, it is optimal for the respective hole transport layers of the R, G, and B colors to each have a film thickness of 15 nm. According to FIG. 4D compared with Example 1, in order to increase the light-extraction efficiency in Comparative example 1, it is optimal for the respective hole transport layers of the R, G, and B colors to have a film thickness of 20 nm, a film thickness of 9 nm, and a film thickness of 5 nm, respectively. In Example 1, the respective hole transport layers of the R, G, and B colors have the same optimal film thickness for increasing light-extraction efficiency. In Comparative example 1 compared with Example 1, the respective hole transport layers of the R, G, and B colors each have a different optimal film thickness for increasing light-extraction efficiency. The difference between Example 1 and Comparative example 1 results from the film thickness adjustment on the organic light-emitting layer. Actually, in Example 1, the film thickness of the organic light-emitting layer for each of the R, G, and B colors is set such that the respective hole transport layers of the R, G, and B colors have the same film thickness corresponding to the first local maximum of light-extraction efficiency of a corresponding color in the case where CFs are used. Specifically, the respective organic light-emitting layers of the R, G, and B colors have a film thickness of 90 nm, a film thickness of 70 nm, and a film thickness of 55 nm, respectively. In Comparative example 1 compared with Example 1, such a design concept was not introduced. The respective organic light-emitting layers of the R, G, and B colors are just set to have the same film thickness as much as possible, within a scope that does not affect light emission. Specifically, the respective organic light-emitting layers of the R, G, and B colors have a film thickness of 80 nm, a film thickness of 80 nm, and a film thickness of 60 nm, respectively. Due to the difference in design concept, there occurs a difference in results between Example 1 and Comparative example 1.

Note that, also in Comparative example 1, as shown in FIG. 4C, in the case where no CF is used, the respective hole transport layers of the R, G, and B colors have the same film thickness corresponding to the first local maximum of light-extraction efficiency of a corresponding color. However, as shown in FIG. 4D, in the case where CFs are used, the respective hole transport layers of the R, G, and B colors each have a different film thickness corresponding to the first local maximum of light-extraction efficiency of the corresponding color. This is because in the case where the CFs are used, the degree at which chromaticity correction needs to be performed for approximating to the target chromaticity differs for each of the R, G, and B colors. The larger the degree at which the chromaticity correction is performed is, the larger variation occurs in film thickness of the hole transport layer corresponding to the first local maximum of light-extraction efficiency. According to FIG. 4D, the film thickness of the hole transport layer corresponding to the first local maximum varies in the order of B, G, and R. This suggests that in the case where each layer constituting the first functional layer is designed so as to have an optimal film thickness on the assumptions that no CF is used, the use of CFs does not necessarily make each designed layer to have an optimal film thickness. In other words, in the case where the use of CFs is assumed, the film thickness of each layer needs to be considered in view of the degree at which chromaticity correction needs to be performed for approximating to the target chromaticity for each of the R, G, and B colors and further in view of the CF characteristics. In Example 1, the results are obtained after consideration of the film thickness of each layer in view of the CF characteristics, and an optimal design is made for the case where CFs are used.

In Example 1, the respective hole transport layers of the R, G, and B colors have the same film thickness. Furthermore, the respective first functional layers of the R, G, and B colors have the same film thickness. Also, the respective organic light-emitting layers of the R, G, and B colors each have a different film thickness. As shown below, it is often the case where the light-extraction efficiency is increased more by making film thickness adjustment on the organic light-emitting layer for each of the R, G, and B colors than by making film thickness adjustment on the first functional layer.

Figure 5A:
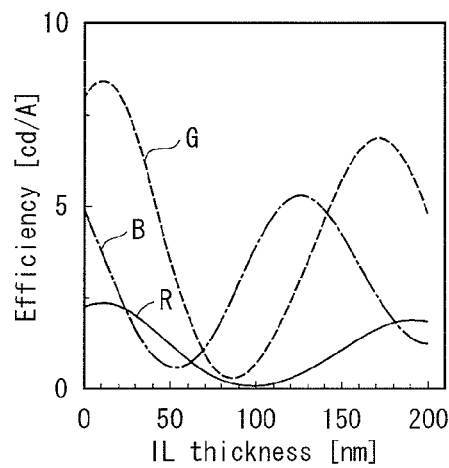
FIG. 5A to FIG. 5D each show variation of light-extraction efficiency when varying the film thickness of a layer constituting an organic EL element.
Figure 5C:
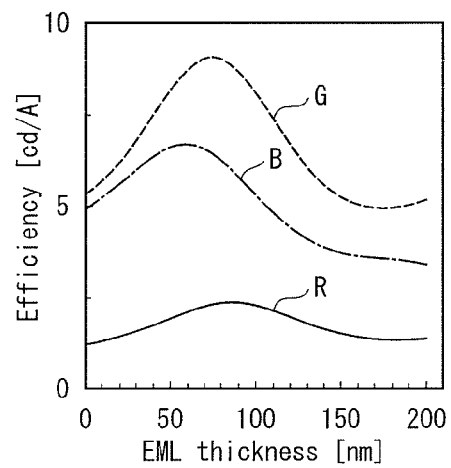
Figure 5B:
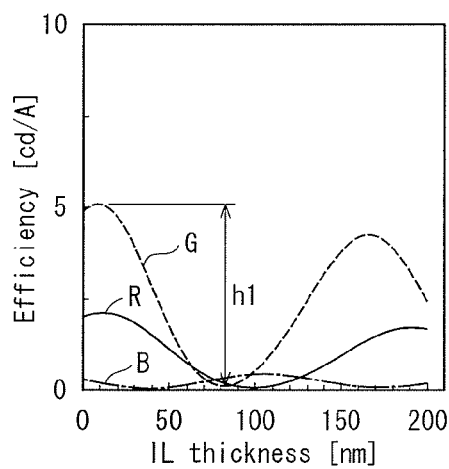
Figure 5D:
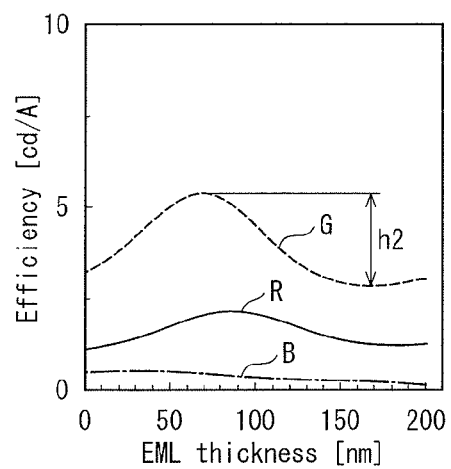

FIG. 5A to FIG. 5D each show variation of light-extraction efficiency when varying the film thickness of a layer constituting an organic EL element. Specifically, FIG. 5A and FIG. 5B show variation of light-extraction efficiency when varying the film thickness of the hole transport layer, in the case where no CF is used and the case where CFs are used, respectively. FIG. 5C and FIG. 5D show variation of light-extraction efficiency when varying the film thickness of the organic light-emitting layer, in the case where no CF is used and the case where CFs are used, respectively.

Comparison of FIG. 5B and FIG. 5D shows that the hole transport layer and the organic light-emitting layer are substantially equal to each other in cycle of variation of light-extraction efficiency corresponding to the film thickness, and differ from each other in variation width of the light-extraction efficiency, specifically, have a variation width h1 and a variation width h2, respectively. In other words, the organic light-emitting layer is smaller in ratio of variation of light-extraction efficiency to variation of film thickness than the hole transport layer.

In the case where the inkjet method is used for forming each layer constituting the organic EL element, the film thickness of the layer is adjusted by adjusting the number of drops of ink. Since the amount of one drop of ink is the minimum unit for adjustment of film thickness, the film thickness adjustment needs to be made not continuously but discretely. In this case, film thickness adjustment should be made on a layer having a smaller ratio of variation of light-extraction efficiency to variation of film thickness. This is advantageous for exact adjustment on the layer so as to have a film thickness corresponding to the highest light-extraction efficiency.

In Example 1, film thickness adjustment for each of the R, G, and B colors is made on the organic light-emitting layer. This makes it easy to exactly adjust the layer so as to have a film thickness corresponding to the highest light-extraction efficiency.

FIG. 6A and FIG. 6B show light-extraction efficiency and so on when the hole transport layer is set to have an optimal film thickness in Example 1 and Comparative example 1, respectively.

In Example 1 as described above, the respective hole transport layers of the R, G, and B colors each have an optimal film thickness of 15 nm. Here, the respective organic EL elements of the R, G, and B colors exhibit a light-extraction efficiency of 2.1 cd/A, a light-extraction efficiency of 5.0 cd/A, and a light-extraction efficiency of 0.51 cd/A, respectively. Also, the respective organic EL elements of the R, G, and B colors exhibit a chromaticity of (0.66, 0.34), a chromaticity of (0.28, 0.68), and a chromaticity (0.13, 0.06), respectively. Furthermore, respective tolerable limits of difference in film thickness of the respective first functional layers of the R, G, and B colors are a range of −10 nm to +10 nm, a range of −9 nm to +11 nm, and a range of −15 nm to +11 nm, respectively. Tolerable margin widths of the respective first functional layers of the R, G, and B colors are 20 nm, 20 nm, and 26 nm, respectively The "tolerable limits of difference in film thickness" indicate the tolerable limits of difference in film thickness of each layer from the optimal value under the conditions that allowable ranges shown in FIG. 7 are satisfied. FIG. 7 shows the following allowable ranges of:

(1) 20% or lower variation of light-extraction efficiency at a surface of the organic EL panel;

(2) variation of chromaticity of x of 0.04 or less and y of 0.04 or less at the surface of the organic EL panel;

(3) a brightness of 90% or higher at a viewing angle of 30° with respect to a brightness at a viewing angle of 0° and a brightness of 80% or higher at a viewing angle of 45° with respect to a brightness at a viewing angle of 0°; and (4) difference in chromaticity of x of 0.04 or less and y of 0.04 or less between a viewing angle of 50° and a viewing angle of 0°.

Broader tolerable limits of difference in film thickness make it easier to adjust the film thickness on each layer during the manufacturing process. The "tolerable margin width" indicates a difference between the upper limit and the lower limit in the tolerable limits of difference in film thickness (for example, each layer of the R color in Example 1 has a tolerable margin width of 20 which is the difference between the upper limit of +10 and the lower limit of −10).

In Comparative example 1 compared with Example 1, the respective hole transport layers of the R, G, and B colors have an optimal film thickness of 20 nm, an optimal film thickness of 9 nm, and an optimal film thickness of 5 nm, respectively. Here, the respective organic EL elements of the R, G, and B colors exhibit a light-extraction efficiency of 2.1 cd/A, a light-extraction efficiency of 5.0 cd/A, and a light-extraction efficiency of 0.51 cd/A, respectively. Also, the respective organic EL elements of the R, G, and B colors exhibit a chromaticity of (0.66, 0.34), a chromaticity of (0.28, 0.68), and a chromaticity (0.13, 0.06), respectively. Furthermore, respective tolerable limits of difference in film thickness of the first functional layers of the R, G, and B colors are a range of −11 nm to +9 nm, a range of −7 nm to +11 nm, and a range of −7 nm to +11 nm, respectively. Tolerable margin widths of the first functional layers of the R, G, and B colors are 20 nm, 18 nm, and 18 nm, respectively.

According to Example 1 as described above, it is possible to exhibit the light-extraction efficiency and the chromaticity that are at the same level as those exhibited in Comparative example 1, and also to set the respective first functional layers of the R, G, and B colors to have the same film thickness. As a result, it is possible to realize both the increase in light-extraction efficiency and the simplification of the manufacturing process.

Also in more detail, each layer constituting the organic EL element should have a film thickness within a range of ±10% of a film thickness obtained through the simulations in view of manufacturing errors. FIG. 8A to FIG. 8C each show the minimum value, the average value, and the maximum value of the film thickness of each layer constituting the organic EL element in Example 1, with respect to the R, G, and B colors, respectively. Specifically, the respective transparent conductive layers of the R, G, and B colors each should have a film thickness of 13.5 nm to 16.5 nm. The respective hole injection layers of the R, G, and B colors each should have a film thickness of 4.5 nm to 5.5 nm. The respective hole transport layers of the R, G, and B colors each should have a film thickness of 13.5 nm to 16.5 nm. The respective electron transport layers of the R, G, and B colors each should have a film thickness of 27 nm to 33 nm. Here, the respective organic light-emitting layers of the R, G, and B colors each have an optical distance of 57.6 nm to 70.4 nm from the reflective electrode, and each have an optical distance of 48.6 nm to 59.4 nm from the transparent electrode. Also, the respective organic light-emitting layers of the R, G, and B colors should have a film thickness of 81 nm to 99 nm, a film thickness of 63 nm to 77 nm, and a film thickness of 49.5 nm to 60.5 nm, respectively.

[Second Simulations]

The present inventors further prepared Example 2 and Comparative example 2, and calculated an optimal film thickness of each layer constituting an organic EL element in Example 2 and Comparative example 2 through simulations. The second simulations differ from the first simulations in that a reflective electrode and a transparent conductive layer used in the second simulations are formed from an alloy of Al and IZO (Indium Zinc Oxide), respectively.

Figure 9A:
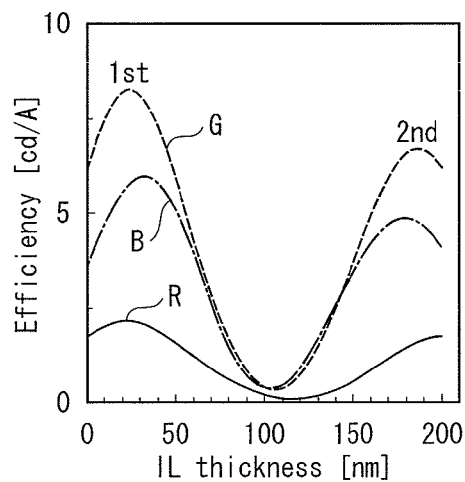
FIG. 9A to FIG. 9D show variation of light-extraction efficiency when varying the film thickness of a hole transport layer.
Figure 9C:
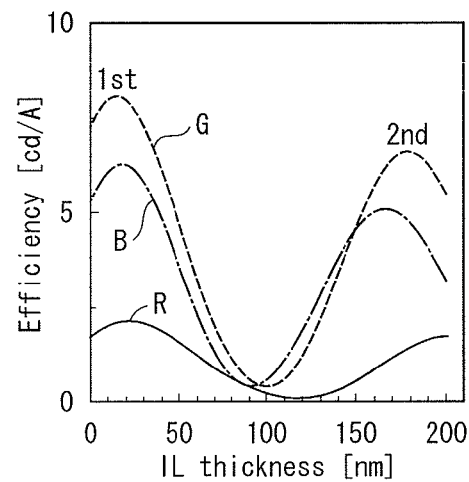
Figure 9B:
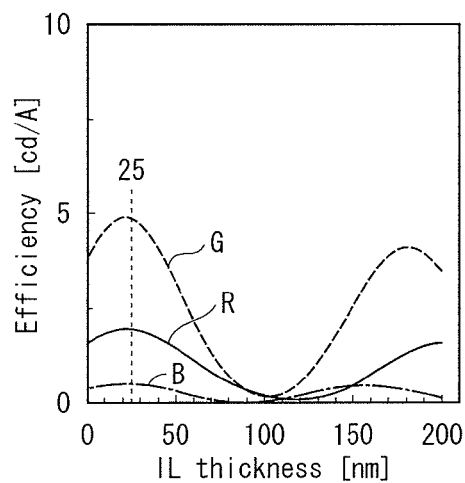

FIG. 9A to FIG. 9D show variation of light-extraction efficiency when varying the film thickness of the hole transport layer, FIG. 9A shows the case where no CF is used in Example 2, FIG. 9B shows the case where CFs are used in Example 2, FIG. 9C shows the case where no CF is used in Comparative example 2, and FIG. 10D shows the case where CFs are used in Comparative example 2.

In Example 2, an electron transport layer of each of the R, G, and B colors has a fixed film thickness of 30 nm, a hole injection layer of each of the R, G, and B colors has a fixed film thickness of 5 nm, a transparent conductive layer of each of the R, G, and B colors has a fixed film thickness of 20 nm. Respective organic light-emitting layers of the R, G, and B colors have a fixed film thickness of 80 nm, a fixed film thickness of 60 nm, and a fixed film thickness of 20 nm, respectively. The film thickness of only the hole transport layer is varied.

In Comparative example 2, an electron transport layer of each of the R, G, and B colors has a fixed film thickness of 30 nm, a hole injection layer of each of the R, G, and B colors has a fixed film thickness of 5 nm, a transparent conductive layer of each of the R, G, and B colors has a fixed film thickness of 20 nm. Respective organic light-emitting layers of the R, G, and B colors have a fixed film thickness of 80 nm, a fixed film thickness of 80 nm, and a fixed film thickness of 60 nm, respectively. The film thickness of only the hole transport layer is varied.

The film thickness of the first functional layer differs between in the first simulations and in the second simulations because of the difference of the materials of the reflective electrode and the transparent conductive layer between in the first simulations and in the second simulations.

Figure 9D:
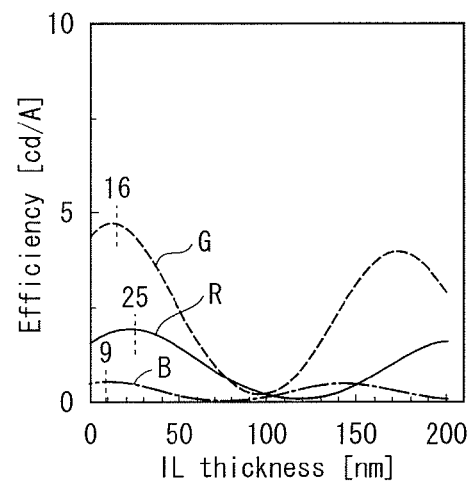

According to FIG. 9B, in order to increase the light-extraction efficiency in Example 2, it is optimal for the respective hole transport layers of the R, G, and B colors each to have a film thickness of 25 nm. According to FIG. 9D compared with Example 2, in order to increase the light-extraction efficiency in Comparative example 2, it is optimal for the respective hole transport layers of the R, G, and B colors to have a film thickness of 25 nm, a film thickness of 16 nm, and a film thickness of 9 nm, respectively. In this way, in terms of optimal film thickness for increasing the light-extraction efficiency, while the respective hole transport layers of the R, G, and B colors are equal to one another in Example 2, the respective hole transport layers of the R, G, and B colors differ from one another in Comparative example 2. The reason for this is as described in the first simulations. In Example 2, the respective organic light-emitting layers of the R, G, and B colors are set to have a film thickness of 80 nm, a film thickness of 60 nm, and a film thickness of 20 nm, respectively, such that the respective hole transport layers of the R, G, and B colors have the same film thickness corresponding to the first local maximum of light-extraction efficiency of a corresponding color in the case where CFs are used. In Comparative example 2 compared with Example 2, the respective organic light-emitting layers of the R, G, and B colors are set to have a film thickness of 80 nm, a film thickness of 80 nm, and a film thickness of 60 nm, respectively, in the same manner as in the first simulations.

Note that, as shown in FIG. 9A, in Example 2, in the case where no CF is used, the respective hole transport layers of the R, G, and B colors each have a slightly different film thickness corresponding to the first local maximum of light-extraction efficiency of a corresponding color. Compared with this as shown in FIG. 9B, in the case where CFs are used, the respective hole transport layers of the R, G, and B colors have the same film thickness corresponding to the first local maximum of light-extraction efficiency of the corresponding color. In Example 2 in this way, an optimal design is made for the case where CFs are used.

FIG. 10A and FIG. 10B show light-extraction efficiency and so on when the hole transport layer is set to have an optimal film thickness in Example 2 and Comparative example 2, respectively.

In Example 2 as described above, the respective hole transport layers of the R, G, and B colors each have an optimal film thickness of 25 nm. Here, the respective organic EL elements of the R, G, and B colors exhibit a light-extraction efficiency of 1.9 cd/A, a light-extraction efficiency of 4.8 cd/A, and a light-extraction efficiency of 0.51 cd/A, respectively. Also, the respective organic EL elements of the R, G, and B colors exhibit a chromaticity of (0.66, 0.34), a chromaticity of (0.28, 0.67), and a chromaticity (0.13, 0.06), respectively. Furthermore, respective tolerable limits of difference in film thickness of the respective first functional layers of the R, G, and B colors are a range of −13 nm to +13 nm, a range of −18 nm to +10 nm, and a range of −14 nm to +11 nm, respectively. Tolerable margin widths of the respective first functional layers of the R, G, and B colors are 26 nm, 28 nm, and 25 nm, respectively.

In Comparative example 2, the respective hole transport layers of the R, G, and B colors have an optimal film thickness of 25 nm, an optimal film thickness of 16 nm, and an optimal film thickness of 9 nm, respectively. Here, the respective organic EL elements of the R, G, and B colors exhibit a light-extraction efficiency of 1.9 cd/A, a light-extraction efficiency of 4.7 cd/A, and a light-extraction efficiency of 0.49 cd/A, respectively. Also, the respective organic EL elements of the R, G, and B colors exhibit a chromaticity of (0.66, 0.34), a chromaticity of (0.28, 0.67), and a chromaticity (0.13, 0.06), respectively. Furthermore, respective tolerable limits of difference in film thickness of the respective first functional layers of the R, G, and B colors are a range of −13 nm to +13 nm, a range of −17 nm to +11 nm, and a range of −9 nm to +11 nm, respectively. Tolerable margin widths of the respective first functional layers of the R, G, and B colors are 26 nm, 28 nm, and 20 nm, respectively.

According to Example 2 as described above, it is possible to exhibit the light-extraction efficiency and the chromaticity that are at the same level as those exhibited in Comparative example 2, and also to set the respective first functional layers of the R, G, and B colors to have the same film thickness. As a result, it is possible to realize both the increase in light-extraction efficiency and the simplification of the manufacturing process.

Also in more detail, each layer constituting the organic EL element should have a film thickness within a range of ±10% of a film thickness obtained through the simulations in view of manufacturing errors. FIG. 11A to FIG. 11C each show the minimum value, the average value, and the maximum value of the film thickness of each layer constituting the organic EL element in Example 2, with respect to the R, G, and B colors, respectively. Specifically, the respective transparent conductive layers of the R, G, and B colors each should have a film thickness of 18 nm to 22 nm. The respective hole injection layers of the R, G, and B colors each should have a film thickness of 4.5 nm to 5.5 nm. The respective hole transport layers of the R, G, and B colors each should have a film thickness of 22.5 nm to 27.5 nm. The respective electron transport layers of the R, G, and B colors each should have a film thickness of 27 nm to 33 nm. Here, the respective organic light-emitting layers of the R, G, and B colors each have an optical distance of 81.5 nm to 99.6 nm from the reflective electrode, and each have an optical distance of 48.6 nm to 59.4 nm from the transparent electrode. Also, the respective organic light-emitting layers of the R, G, and B colors should have a film thickness of 72 nm to 88 nm, a film thickness of 54 nm to 66 nm, and a film thickness of 18 nm to 22 nm, respectively.

[Supplementary Description]

The description has been already given on that in the case where CFs are used, the film thickness of each layer needs to be considered in view of the CF characteristics. The following describes this in more detail.

Figure 12A:
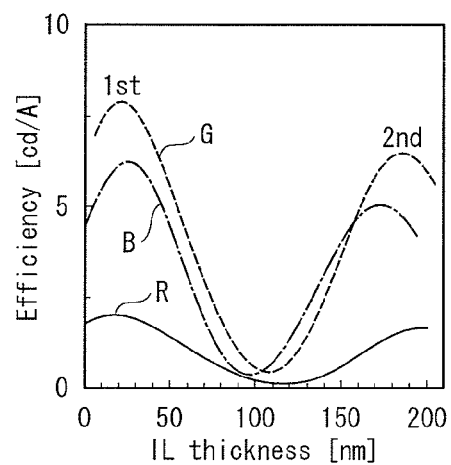
FIG. 12A to FIG. 12D show variation of light-extraction efficiency when varying the film thickness of a hole transport layer.
Figure 12C:
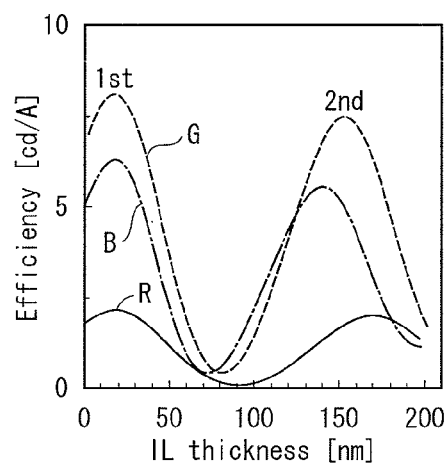
Figure 12B:
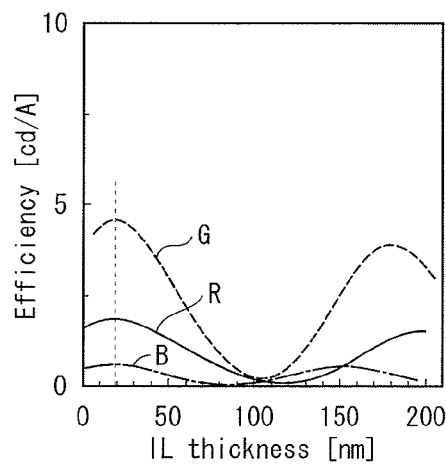
Figure 12D:
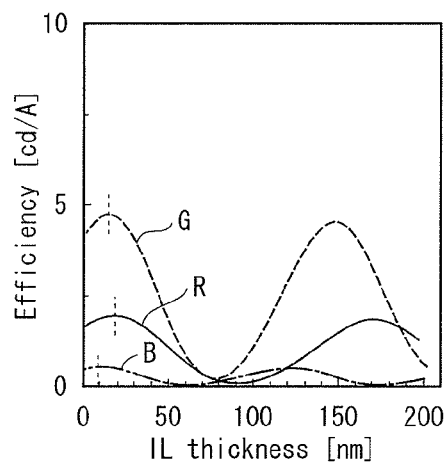
Figure 13A:
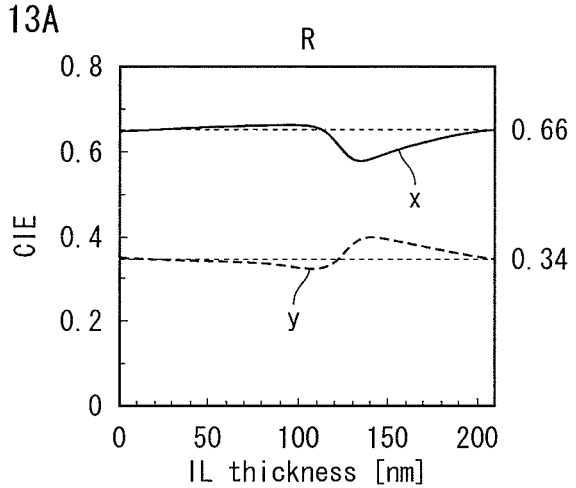
FIG. 13A to FIG. 13C show variation of chromaticity (x,y) when varying the film thickness of respective hole transport layers of the R, G, and B colors, respectively.
Figure 13B:
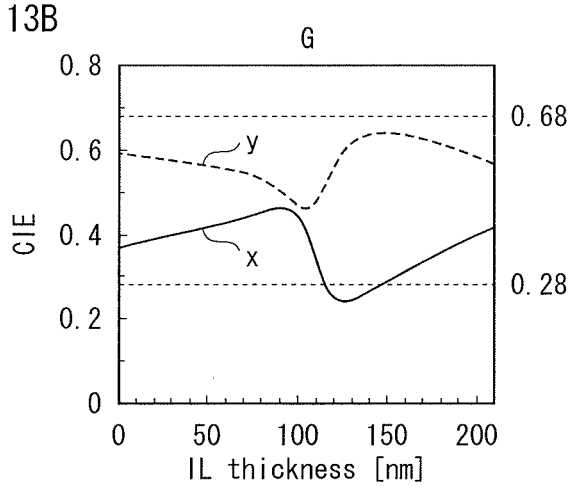
Figure 13C:
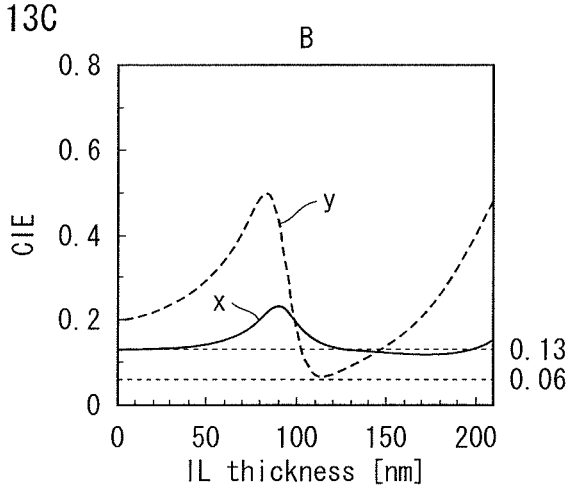

FIG. 12A to FIG. 12D show variation of light-extraction efficiency when varying the film thickness of the hole transport layer, FIG. 12A shows a case where no CF is used in Example 3, FIG. 12B shows a case where CFs are used in Example 3, FIG. 12C shows a case where no CF is used in Comparative example 3, and FIG. 12D shows a case where CFs are used in Comparative example 3. FIG. 13A to FIG. 13C show variation of chromaticity (x,y) when varying the film thickness of the respective hole transport layers of the R, G, and B colors, respectively.

FIG. 12A to FIG. 12D prove that when the film thickness of the hole transport layer is varied, the light-extraction efficiency varies. Also, FIG. 13A to FIG. 13C prove that when the film thickness of the hole transport layer is varied, the chromaticity varies. Furthermore, FIG. 12A to FIG. 12D and FIG. 13A to FIG. 13C prove that a chromaticity corresponding to a local maximum of light-extraction efficiency is not necessarily at the neighborhood of a target chromaticity. Here, the respective target chromaticities of the R, G, and B colors are (0.66, 0.34), (0.28, 0.68), and (0.13, 0.06), respectively.

The more greatly a current chromaticity differs from the target chromaticity in the case where no CF is used, the more chromaticity correction needs to be made with use of CFs. As a result, there is a case where though a chromaticity before chromaticity correction with use of no CF (before passing through CFs) corresponds to a local maximum of light-extraction efficiency, a chromaticity after the chromaticity correction with use of a CF (after passing through CFs) does not correspond to a local maximum of light-extraction efficiency. FIG. 12B and FIG. 12D show this case.

Therefore, in the case where CFs are used, the film thickness of each layer needs to be considered in view of the CF characteristics.

[Specific Examples of Each Layer]

<Substrate>

The substrate 1 is a Thin Film Transistor (TFT) substrate, for example. The substrate 1 is a glass plate or quartz plate of soda glass, nonfluorescent glass, phosphate glass, borate glass, or the like; a plastic plate or plastic film of acrylic resin, styrenic resin, polycarbonate resin, epoxy resin, polyethylene, polyester, silicone resin, or the like; or a metal plate or metal foil of alumina or the like.

<Banks>

The banks 12 should be formed from an insulating material, and it is preferable that the banks 12 have organic solvent resistance. Furthermore, since the banks 12 undergo etching, baking, and the like, it is preferable that the banks 12 be formed from a material that is highly resistant to such processes. The material for the banks 12 may be an organic material such as resin, or an inorganic material such as glass. As an organic material, acrylic resin, polyimide resin, novolac-type phenolic resin, and the like can be used. As an inorganic material, silicon dioxide ($SiO_2$), silicon nitride ($Si_3N_4$), and the like can be used.

<Reflective Electrode>

The reflective electrode 2 is electrically connected to the TFT provided on the substrate 1. In addition to functioning as a positive terminal of the organic EL element, the reflective electrode 2 has the function of reflecting light emitted from the organic light-emitting layers 6b, 6g, and 6r towards the reflective electrode 2. The reflecting function may be achieved by the structural material of the reflective electrode 2 or by applying a reflective coating to the surface portion of the reflective electrode 2. For example, the reflective electrode 2 is formed from Ag (silver), APC (alloy of silver, palladium, and copper), ARA (alloy of silver, rubidium, and gold), MoCr (alloy of molybdenum and chromium), NiCr (alloy of nickel and chromium), or the like.

<Transparent Conductive Layer>

The transparent conductive layer 3 functions as a protective layer to prevent the reflective electrode 2 from naturally oxidizing during the manufacturing process. The material for the transparent conductive layer 3 should be formed from a conductive material sufficiently translucent with respect to light emitted by the organic light-emitting layers 6b, 6g, and 6r. For example, the transparent conductive layer 3 is preferably formed from ITO or IZO, which achieve good conductivity even when a film thereof is formed at room temperature.

<Hole Injection Layer>

The hole injection layer 4 has the function of injecting holes into the organic light-emitting layers 6b, 6g, and 6r. The hole injection layer 4 is formed from an oxide of a transition metal, such as tungsten oxide (WOx), molybdenum oxide (MoOx), and molybdenum tungsten oxide (MoxWyOz). Forming the hole injection layer 4 from an oxide of a transition metal allows for improvement of voltage-current density characteristics, and for an increase in emission intensity by increasing current density. Note that other metal compounds, such as a transition metal nitride, may also be used.

<Hole Transport Layer>

Examples of the material for the hole transport layer 5 include a triazole derivative, an oxadiazole derivative, an imidazole derivative, a polyarylalkane derivative, a pyrazoline derivative and pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound and styrylamine compound, a butadiene compound, a polystyrene derivative, a hydrazone derivative, a triphenylmethane derivative, or a tetraphenylbenzene derivative, as disclosed in Japanese Patent Application Publication No. 5-163488. In particular, a porphyrin compound, as well as an aromatic tertiary amine compound and styrylamine compound, are preferable.

<Organic Light-Emitting Layer>

The organic light-emitting layers 6b, 6g, and 6r are formed from a fluorescent material such as, for example, an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, and the like, as recited in Japanese Patent Application Publication No. H5-163488.

<Electron Transport Layer>

Examples of the material for the electron transport layer 7 include a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, and a quinolone complex derivative, as recited in Japanese Patent Application Publication No. H5-163488.

Note that from the perspective of further improving electron injection characteristics, the above materials for forming the electron transport layer may be doped with an alkali metal or an alkaline-earth metal, such as Na, Ba, or Ca.

<Transparent Electrode>

The transparent electrode 8 functions as a negative electrode for the organic EL element. The material for the transparent electrode 8 should be formed from a conductive material sufficiently translucent with respect to light emitted by the organic light-emitting layers 6b, 6g, and 6r. For example, the transparent electrode 8 is preferably formed from ITO or IZO.

<Thin-Film Passivation Layer>

The thin-film passivation layer 9 has the function of preventing the layers interposed between the substrate 1 and the thin-film passivation layer 9 from being exposed to moisture or air. The material for the thin-film passivation layer 9 is, for example, silicon nitride (SiN), silicon oxynitride (SiON), resin, or the like.

<Resin Passivation Layer>

The resin passivation layer 10 has the functions of adhering a back panel, which is composed of the layers from the substrate 1 to the thin-film passivation layer 9, to the substrate 11, on which are formed the color filters 13b, 13g, and 13r, and of preventing the layers from being exposed to moisture or air. The material for the resin passivation layer 10 is, for example, a resin adhesive or the like.

<Color Filters>

The color filters 13b, 13g, and 13r have the function of correcting the chromaticity of light emitted by the organic light-emitting layers.

[Organic Display Device]

Figure 14:
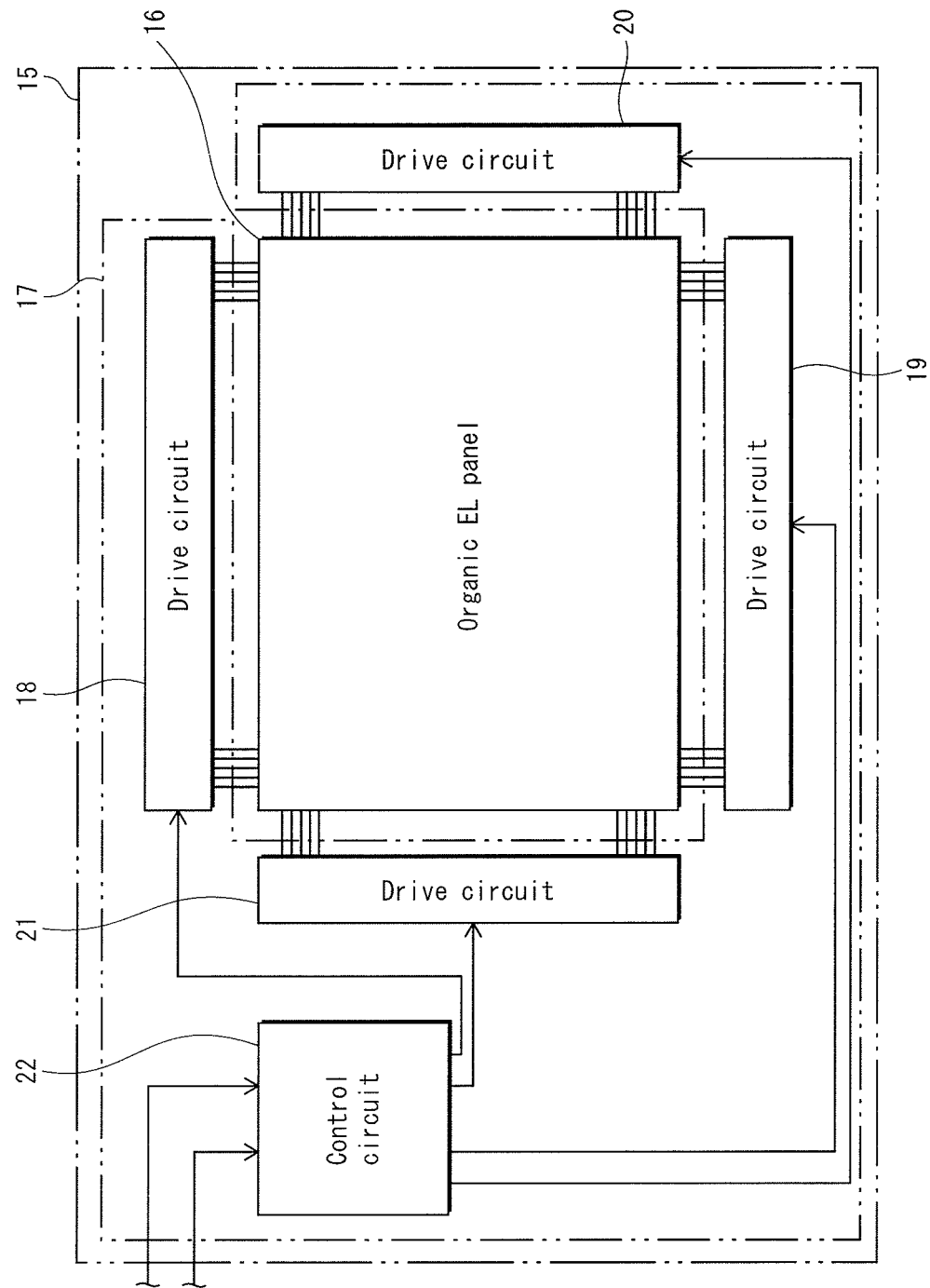
FIG. 14 is a functional block showing an organic display device according to the embodiment of the present invention.
Figure 15:
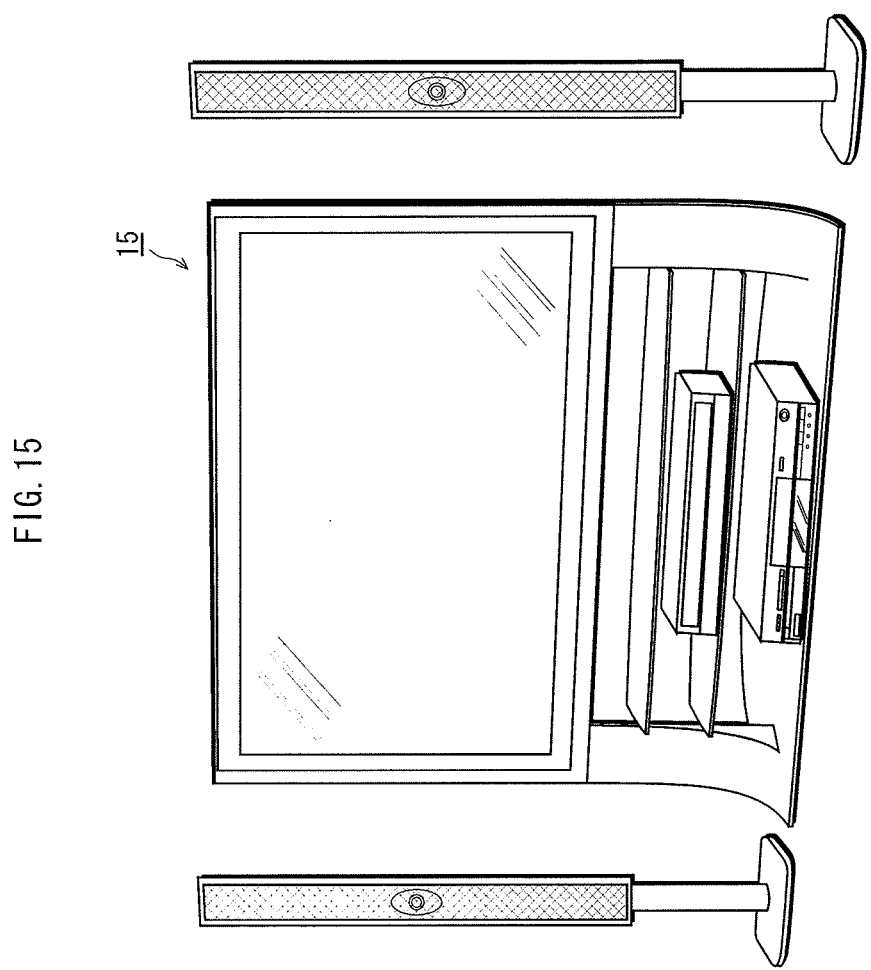
FIG. 15 is an exemplary external diagram showing the organic display device according to the embodiment of the present invention.

FIG. 14 is a functional block showing an organic display device according to the embodiment of the present invention. FIG. 15 is an exemplary external diagram showing the organic display device according to the embodiment of the present invention. An organic display device 15 includes an organic display panel 16 and a drive control unit 17 that are electrically connected to each other. The organic display panel 16 has the pixel structure shown in FIG. 1. The drive control unit 17 includes drive circuits 18 to 21 that apply voltage between the reflective electrode 2 corresponding to each organic EL element and a transparent electrode 8, and a control circuit 22 that controls operations of the drive circuits 18 to 21.

[Method of Manufacturing Organic EL Panel]

Next, the method of manufacturing an organic EL panel is described. FIG. 16A to FIG. 16D and FIG. 17A to FIG. 17C show a method of manufacturing an organic EL panel according to the embodiment of the present invention.

Figure 16A:
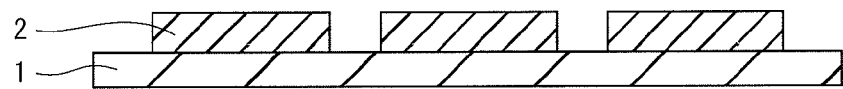
FIG. 16A to FIG. 16D show a method of manufacturing the organic EL panel according to the embodiment of the present invention.
Figure 16B:
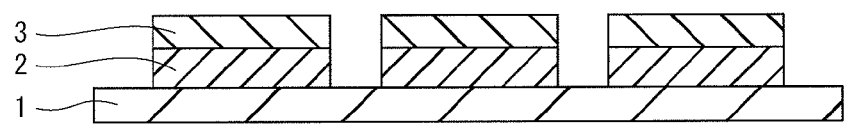

First, reflective electrodes 2 are formed on a substrate 1 by a vapor deposition method, a sputtering method, or the like (FIG. 16A). Next, transparent conductive layers 3 are formed on the respective reflective electrodes 2 by the vapor deposition method, the sputtering method, or the like (FIG. 16B). The respective transparent conductive layers 3 of the R, G, and B colors are set to have the same film thickness.

Figure 16C:
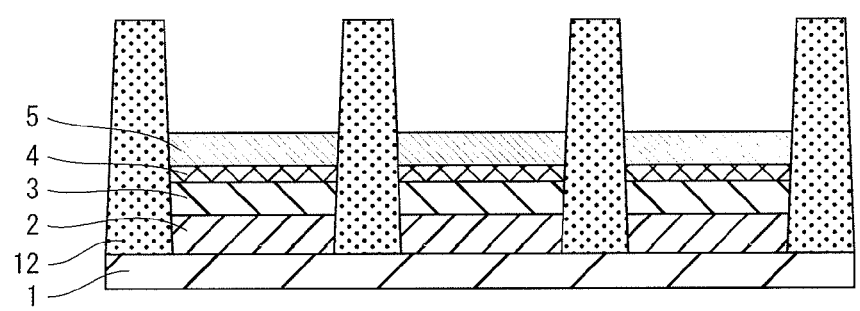

Next, on each of the transparent conductive layers 3, a hole injection layer 4, for example, is formed by the vapor deposition method, the sputtering method, or the like. Then, banks 12 are formed. Furthermore, on each of the hole injection layers 4, a hole transport layer 5, for example, is formed by a printing method such as the inkjet method (FIG. 16C). The respective hole injection layers 4 of the R, G, and B colors are set to have the same film thickness. Also, the respective hole transport layers 5 of the R, G, and B colors are set to have the same film thickness.

Figure 16D:
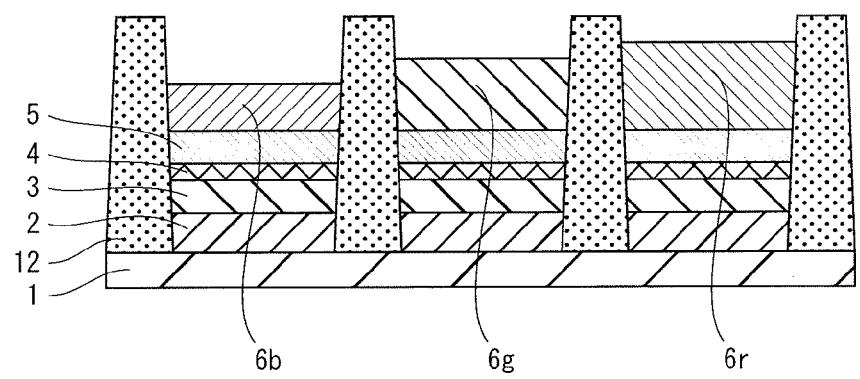

Next, on the respective hole transport layers 5, light-emitting layers 6b, 6g, and 6r, for example, are formed by a printing method such as the inkjet method (FIG. 16D). The respective organic light-emitting layers 6b, 6g, and 6r are set to appropriately have a different film thickness.

Figure 17A:
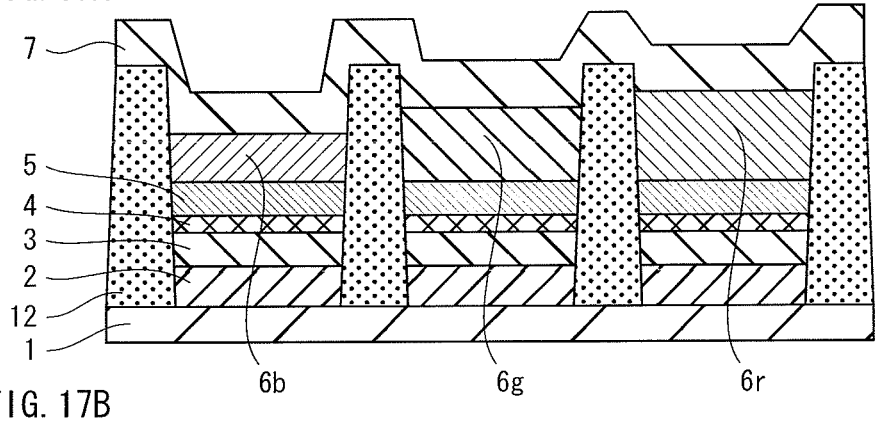
FIG. 17A to FIG. 17C show the method of manufacturing the organic EL panel according to the embodiment of the present invention.

Next, on the light-emitting layers 6b, 6g, and 6r, an electron transport layer 7 is formed by the vapor deposition method, the sputtering method, or the like (FIG. 17A). The respective electron transport layers 7 of the R, G, and B colors are set to have the same film thickness.

Figure 17B:
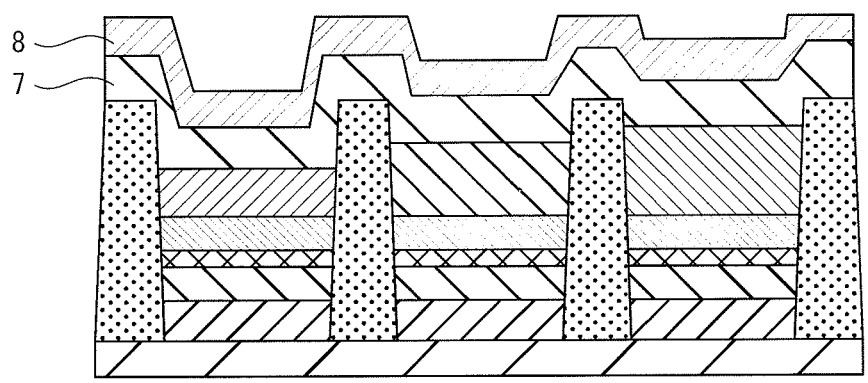

Next, on the electron transport layer 7, a transparent electrode 8 is formed by the vapor deposition method, the sputtering method, or the like (FIG. 17B). The transparent electrode 8 has a film thickness of 90 nm to 110 nm, for example.

Figure 17C:
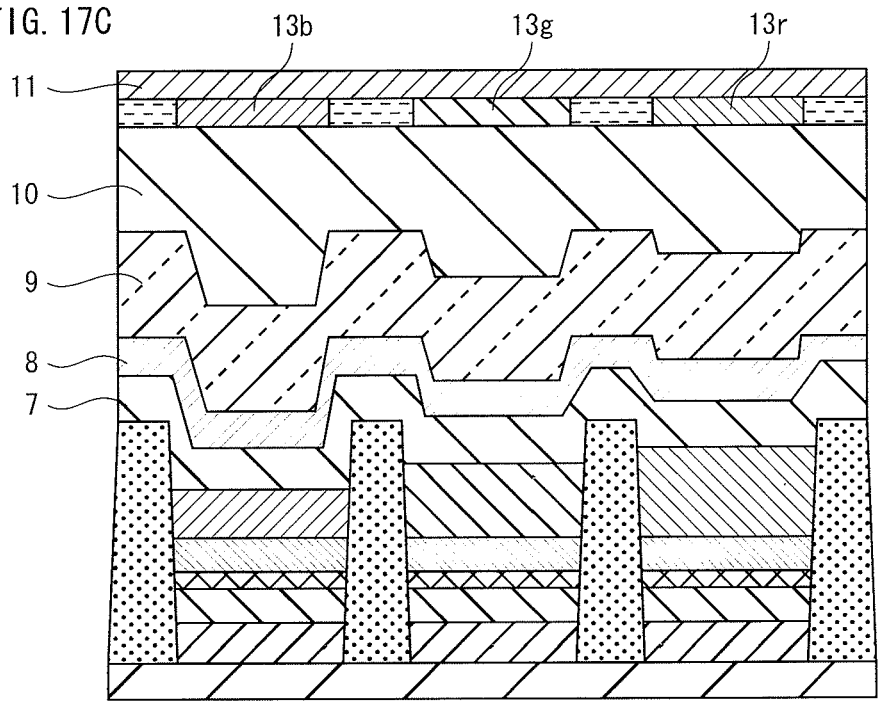

Next, a thin-film passivation layer 9 is formed on the transparent electrode 8 by the vapor deposition method, the sputtering method, or the like, and a substrate 11 in which color filters 13b, 13g, and 13r are formed is adhered thereto using a resin passivation layer 10 (FIG. 17C). These passivation layers each have a film thickness of 900 nm to 1100 nm, for example.

Although the present invention has been described based on the above embodiment, the present invention is not limited to the above embodiment. The present invention may include the following modification examples.

(1) In Example 1, the respective first functional layers of the R, G, and B colors each have a film thickness of 31.5 nm to 38.5 nm. The present invention is not limited to this. It is considered that the effect of increasing the light-extraction efficiency is exhibited due to the interference phenomenon that occurs between light traveling the first optical path C1 and light traveling the second optical path C2. This leads to an idea that what is important is not the film thickness of the first functional layer, but the optical distance between the organic light-emitting layer and the reflective electrode. Therefore, the respective organic light-emitting layers of the R, G, and B colors each should have an optical distance of 57.6 nm to 70.4 nm from the reflective electrode. As long as this condition is satisfied, the same effect is exhibited even if the film thickness of the first functional layer is varied.

Also, in Example 2, the respective first functional layers of the R, G, and B colors each have a film thickness of 45 nm to 55 nm. The present invention is not limited to this. The respective organic light-emitting layers of the R, G, and B colors each should have an optical distance of 81.5 nm to 99.6 nm from the reflective electrode. As long as this condition is satisfied, the same effect is exhibited even if the film thickness of the first functional layer is varied.

Also, although the second functional layer has a film thickness of 27 nm to 33 nm, the present invention is not limited to this similarly. The respective organic light-emitting layers of the R, G, and B colors each should have an optical distance of 48.6 nm to 59.4 nm. As long as this condition is satisfied, the same effect is exhibited even if the film thickness of the second functional layer is varied.

(2) In the above embodiment, the first functional layer is constituted from the transparent conductive layer, the hole injection layer, and the hole transport layer. Alternatively, the first functional layer may not include any one of the transparent conductive layer, the hole injection layer, and the hole transport layer. Further alternatively, the first functional layer may further include another functional layer.

(3) In the above embodiment, the second functional layer is constituted from the hole transport layer. Alternatively, the second functional layer may further include an electron injection layer, for example.

INDUSTRIAL APPLICABILITY

The present invention is applicable to organic EL displays and the like.

REFERENCE SIGNS LIST 1 substrate
2 reflective electrode
3 transparent conductive layer
4 hole injection layer
5 hole transport layer
6b, 6g, and 6r organic light-emitting layer
7 electron transport layer
8 transparent electrode
9 thin-film passivation layer
10 resin passivation layer
11 substrate
12 bank
13b, 13g, and 13r color filter
15 organic display device
16 organic display panel
17 drive control unit
18 to 21 drive circuit
22 control circuit

The invention claimed is:
1. An organic electro luminescence (EL) panel, comprising:
a first electrode of each of red (R), green (G), and blue (B) colors that reflects incident light;
a second electrode that faces the first electrode of each of the R, G, and B colors, and transmits incident light therethrough;
an organic light-emitting layer of each of the R, G, and B colors that is disposed between the first electrode of a corresponding color and the second electrode, and emits light of a corresponding color due to voltage application between the first electrode of the corresponding color and the second electrode;
a first functional layer of each of the R, G, and B colors that is disposed between the first electrode of a corresponding color and the organic light-emitting layer of a corresponding color;
a second functional layer of each of the R, G, and B colors that is disposed between the second electrode and the organic light-emitting layer of a corresponding color; and
a color filter of each of the R, G, and B colors for chromaticity correction that is disposed opposite the organic light-emitting layer of a corresponding color with the second electrode being interposed therebetween, wherein
a first portion of light of each of the R, G, and B colors emitted from the organic light-emitting layer of a corresponding color travels through the first functional layer of a corresponding color towards the first electrode of a corresponding color, strikes and is reflected by the first electrode of the corresponding color, and then is emitted externally after passing through the first functional layer of the corresponding color, the organic light-emitting layer of the corresponding color, the second functional layer of a corresponding color, the second electrode, and the color filter of a corresponding color,
a second portion of the light of each of the R, G, and B colors travels through the second functional layer of the corresponding color towards the second electrode instead of towards the first electrode of the correspond- ing color, and is emitted externally after passing through the second electrode and the color filter of the corresponding color, the respective first functional layers of the R, G, and B colors are equal in film thickness to one another, the respective organic light-emitting layers of the R, G, and B colors are equal to one another in optical distance from the first electrode of the corresponding color, the respective second functional layers of the R, G, and B colors are equal in film thickness to one another, the respective organic light-emitting layers of the R, G, and B colors are equal to one another in optical distance from the second electrode, the respective organic light-emitting layers of the R, G, and B colors differ in film thickness from one another, and the film thickness of the organic light-emitting layer of the B color is not close to a film thickness at which maximum light-extraction efficiency occurs when the color filter of the B color is not provided, and is close to a film thickness at which maximum light-extraction efficiency occurs when the color filter of the B color is provided.

2. The organic EL panel of claim 1, wherein the film thickness of the organic light-emitting layer of each of the R, G, and B colors is adjusted so as to correspond to a local maximum of light-extraction efficiency with respect to the light of the corresponding color emitted externally after passing through the color filter of the corresponding color.

3. The organic EL panel of claim 2, wherein a film thickness of the first functional layer of each of the R, G, and B colors is adjusted so as to correspond to a first local maximum of light-extraction efficiency with respect to the light of the corresponding color emitted externally after passing through the color filter of the corresponding color.

4. The organic EL panel of claim 3, wherein at least one of the respective organic light-emitting layers of the R, G, and B colors has a film thickness that does not correspond to a local maximum of light-extraction efficiency with respect to the light of the corresponding color before passing through the color filter of the corresponding color.

5. The organic EL panel of claim 1, wherein the respective first functional layers of the R, G, and B colors each have a film thickness of 31.5 nm to 38.5 nm, the respective organic light-emitting layers of the R, G, and B colors each have an optical distance of 57.6 nm to 70.4 nm from the first electrode of the corresponding color, and the respective organic light-emitting layers of the R, G, and B colors have a film thickness of 81 nm to 99 nm, a film thickness of 63 nm to 77 nm, and a film thickness of 49.5 nm to 60.5 nm, respectively.

6. The organic EL panel of claim 5, wherein the first functional layer of each of the R, G, and B colors includes a transparent conductive layer formed on an anode that is the first electrode of the corresponding color, a hole injection layer formed on the transparent conductive layer, and a hole transport layer formed on the hole injection layer, the respective transparent conductive layers of the R, G, and B colors each have a film thickness of 13.5 nm to 16.5 nm, the respective hole injection layers of the R, G, and B colors each have a film thickness of 4.5 nm to 5.5 nm, and the respective hole transport layers of the R, G, and B colors each have a film thickness of 13.5 nm to 16.5 nm.

7. The organic EL panel of claim 5, wherein the respective second functional layers of the R, G, and B colors each have a film thickness of 27 nm to 33 nm, and the respective organic light-emitting layers of the R, G, and B colors each have an optical distance of 48.6 nm to 59.4 nm from the second electrode.

8. The organic EL panel of claim 7, wherein the second functional layer of each of the R, G, and B colors includes an electron transport layer having a film thickness of 27 nm to 33 nm.

9. The organic EL panel of claim 1, wherein the respective first functional layers of the R, G, and B colors each have a film thickness of 45 nm to 55 nm, the respective organic light-emitting layers of the R, G, and B colors each have an optical distance of 81.5 nm to 99.6 nm from the first electrode of the corresponding color, and the respective organic light-emitting layers of the R, G, and B colors have a film thickness of 72 nm to 88 nm, a film thickness of 54 nm to 66 nm, a film thickness of 18 nm to 22 nm, respectively.

10. The organic EL panel of claim 9, wherein the first functional layer of each of the R, G, and B colors includes a transparent conductive layer formed on an anode that is the first electrode of the corresponding color, a hole injection layer formed on the transparent conductive layer, and a hole transport layer formed on the hole injection layer, the respective transparent conductive layers of the R, G, and B colors each have a film thickness of 18 nm to 22 nm, the respective hole injection layers of the R, G, and B colors each have a film thickness of 4.5 nm to 5.5 nm, and the respective hole transport layers of the R, G, and B colors each have a film thickness of 22.5 nm to 27.5 nm.

11. The organic EL panel of claim 9, wherein the respective second functional layers of the R, G, and B colors each have a film thickness of 27 nm to 33 nm, and the respective organic light-emitting layers of the R, G, and B colors each have an optical distance of 48.6 nm to 59.4 nm from the second electrode.

12. The organic EL panel of claim 11, wherein the second functional layer of each of the R, G, and B colors includes an electron transport layer having a film thickness of 27 nm to 33 nm.

13. The organic EL panel of claim 1, wherein the organic light-emitting layer of each of the R, G, and B colors contains an organic material, and is formed by a printing method.

14. A display device with use of the organic EL panel of claim 1.

15. The organic EL panel of claim 1, wherein the film thickness of the organic light-emitting layer of the B color at which the maximum light-extraction efficiency occurs when the color filter of the B color is provided is no more than ½ of the film thickness of the organic light-emitting layer of the B color at which the maximum light-extraction efficiency occurs when the color filter of the B color is not provided.

16. The organic EL panel of claim 1, wherein the film thickness of the organic light-emitting layer of the B color at which the maximum light-extraction efficiency occurs when the color filter of the B color is provided is no more than ⅓ of the film thickness of the organic light-emitting layer of the B color at which the maximum light-extraction efficiency occurs when the color filter of the B color is not provided.

17. A manufacturing method of manufacturing an organic electro luminescence (EL) panel, comprising:
- preparing a first electrode of each of red (R), green (G), and blue (B) colors that reflects incident light;
- disposing a first functional layer of each of the R, G, and B colors on the first electrode of a corresponding color;
- disposing an organic light-emitting layer that emits light of each of the R, G, and B colors on the first functional layer of a corresponding color;
- disposing a second functional layer of each of the R, G, and B colors on the organic light-emitting layer of a corresponding color;
- disposing a second electrode that transmits incident light therethrough on the respective second functional layers of the R, G, and B colors so as to face the respective first electrodes of the R, G, and B colors; and
- disposing a color filter of each of the R, G, and B colors for chromaticity correction so as to be opposite the organic light-emitting layer of a corresponding color with the second electrode being interposed therebetween, wherein
- the first functional layer is disposed such that the respective first functional layers of the R, G, and B colors are equal in film thickness to one another, and the respective organic light-emitting layers of the R, G, and B colors are equal to one another in optical distance from the first electrode of the corresponding color,
- the organic light-emitting layer is disposed such that the respective organic light-emitting layers of the R, G, and B colors differ in film thickness from one another, and
- the second functional layer is disposed such that the respective second functional layers of the R, G, and B colors are equal in film thickness to one another, and the respective organic light-emitting layers of the R, G, and B colors are equal to one another in optical distance from the second electrode, and
- the film thickness of the organic light-emitting layer of the B color is not close to a film thickness at which maximum light-extraction efficiency occurs when the color filter of the B color is not provided, and is close to a film thickness at which maximum light-extraction efficiency occurs when the color filter of the B color is provided.

18. The manufacturing method of claim 17, wherein
in the disposing of the organic light-emitting layer, the film thickness of the organic light-emitting layer of each of the R, G, and B colors is adjusted so as to correspond to a local maximum of light-extraction efficiency with respect to the light of the corresponding color emitted externally after passing through the color filter of the corresponding color.

19. The manufacturing method of claim 18, wherein
in the disposing of the first functional layer, a film thickness of the first functional layer of each of the R, G, and B colors is adjusted so as to correspond to a first local maximum of light-extraction efficiency with respect to the light of the corresponding color emitted externally after passing through the color filter of the corresponding color.

20. The manufacturing method of claim 19, wherein
in the disposing of the organic light-emitting layer, the film thickness of the organic light-emitting layer of each of the R, G, and B colors is adjusted such that at least one of the respective organic light-emitting layers of the R, G, and B colors has a film thickness that does not correspond to a local maximum of light-extraction efficiency with respect to the light of the corresponding color before passing through the color filter of the corresponding color.

21. The manufacturing method of claim 17, wherein
in the disposing of the first functional layer, the respective first functional layers of the R, G, and B colors are each adjusted so as to have a film thickness of 31.5 nm to 38.5 nm, and the respective organic light-emitting layers of the R, G, and B colors are each adjusted so as to have an optical distance of 57.6 nm to 70.4 nm from the first electrode of the corresponding color, and
in the disposing of the organic light-emitting layer, the respective organic light-emitting layers of the R, G, and B colors are each adjusted so as to have a film thickness of 81 nm to 99 nm, a film thickness of 63 nm to 77 nm, and a film thickness of 49.5 nm to 60.5 nm, respectively.

22. The manufacturing method of claim 21, wherein
the first functional layer of each of the R, G, and B colors includes a transparent conductive layer formed on an anode that is the first electrode of the corresponding color, a hole injection layer formed on the transparent conductive layer, and a hole transport layer formed on the hole injection layer, and
in the disposing of the first functional layer, the respective transparent conductive layers of the R, G, and B colors are each adjusted so as to have a film thickness of 13.5 nm to 16.5 nm, the respective hole injection layers of the R, G, and B colors are each adjusted so as to have a film thickness of 4.5 nm to 5.5 nm, and the respective hole transport layers of the R, G, and B colors are each adjusted so as to have a film thickness of 13.5 nm to 16.5 nm.

23. The manufacturing method of claim 21, wherein
in the disposing of the second functional layer, the respective second functional layers of the R, G, and B colors are each adjusted so as to have a film thickness of 27 nm to 33 nm, and the respective organic light-emitting layers of the R, G, and B colors are each adjusted so as to have an optical distance of 48.6 nm to 59.4 nm from the second electrode.

24. The manufacturing method of claim 23, wherein
the second functional layer of each of the R, G, and B colors includes an electron transport layer, and
in the disposing of the second functional layer, the respective electron transport layers of the R, G, and B colors are each adjusted so as to have a film thickness of 27 nm to 33 nm.

25. The manufacturing method of claim 17, wherein
in the disposing of the first functional layer, the respective first functional layers of the R, G, and B colors are each adjusted so as to have a film thickness of 45 nm to 55 nm, and the respective organic light-emitting layers of the R, G, and B colors are each adjusted so as to have an optical distance of 81.5 nm to 99.6 nm from the first electrode of the corresponding color, and
in the disposing of the organic light-emitting layer, the respective organic light-emitting layers of the R, G, and B colors are each adjusted so as to have a film thickness of 72 nm to 88 nm, a film thickness of 54 nm to 66 nm, and a film thickness of 18 nm to 22 nm, respectively.

26. The manufacturing method of claim 25, wherein
the first functional layer of each of the R, G, and B colors includes a transparent conductive layer formed on an anode that is the first electrode of the corresponding color, a hole injection layer formed on the transparent conductive layer, and a hole transport layer formed on the hole injection layer, in the disposing of the first functional layer, the respective transparent conductive layers of the R, G, and B colors are each adjusted so as to have a film thickness of 18 nm to 22 nm, the respective hole injection layers of the R, G, and B colors are each adjusted so as to have a film thickness of 4.5 nm to 5.5 nm, and the respective hole transport layers of the R, G, and B colors are each adjusted so as to have a film thickness of 22.5 nm to 27.5 nm.

27. The manufacturing method of claim 25, wherein in the disposing of the second functional layer, the respective second functional layers of the R, G, and B colors are each adjusted so as to have a film thickness of 27 nm to 33 nm, and the respective organic light-emitting layers of the R, G, and B colors are each adjusted so as to have an optical distance of 48.6 nm to 59.4 nm from the second electrode.

28. The manufacturing method of claim 27, wherein
the second functional layer of each of the R, G, and B colors includes an electron transport layer, and
in the disposing of the second functional layer, the respective electron transport layers of the R, G, and B colors are each adjusted so as to have a film thickness of 27 nm to 33 nm.

29. The manufacturing method of claim 17, wherein
the organic light-emitting layer of each of the R, G, and B colors contains an organic material, and is formed by a printing method.

\* \* \* \* \*